US012584212B2

(12) United States Patent
Macdonald et al.

(10) Patent No.: US 12,584,212 B2
(45) Date of Patent: Mar. 24, 2026

(54) COMPOSITIONS AND METHODS USING SAME FOR GERMANIUM SEED LAYER

(71) Applicant: VERSUM MATERIALS US, LLC, Tempe, AZ (US)

(72) Inventors: Matthew R. Macdonald, Mission Viejo, CA (US); Manchao Xiao, San Diego, CA (US)

(73) Assignee: Versum Materials US, LLC, Tempe, AZ (US)

( * ) Notice: Subject to any disclaimer, the term of this patent is extended or adjusted under 35 U.S.C. 154(b) by 428 days.

(21) Appl. No.: 18/006,856

(22) PCT Filed: Jul. 23, 2021

(86) PCT No.: PCT/US2021/042946
§ 371 (c)(1),
(2) Date: Jan. 25, 2023

(87) PCT Pub. No.: WO2022/020705
PCT Pub. Date: Jan. 27, 2022

(65) Prior Publication Data
US 2023/0287562 A1 Sep. 14, 2023

Related U.S. Application Data

(60) Provisional application No. 63/056,341, filed on Jul. 24, 2020.

(51) Int. Cl.

| | |
|---|---|
| ***C23C 16/14*** | (2006.01) |
| ***C07F 7/10*** | (2006.01) |
| ***C23C 16/02*** | (2006.01) |
| ***C23C 16/18*** | (2006.01) |
| ***C23C 16/40*** | (2006.01) |
| ***C23C 16/455*** | (2006.01) |

(52) U.S. Cl.
CPC ................ *C23C 16/14* (2013.01); *C07F 7/10* (2013.01); *C23C 16/0272* (2013.01); *C23C 16/18* (2013.01); *C23C 16/402* (2013.01); *C23C 16/45534* (2013.01); *C23C 16/45553* (2013.01)

(58) Field of Classification Search
CPC .......... C23C 16/14; C23C 16/402; C07F 7/10
See application file for complete search history.

(56) References Cited

U.S. PATENT DOCUMENTS

| | | | | |
|---|---|---|---|---|
| 6,570,032 | B1 * | 5/2003 | Musa | C07F 7/1804 556/443 |
| 8,460,753 | B2 | 6/2013 | Xiao et al. | |
| 8,765,887 | B2 * | 7/2014 | Luo | C08F 4/545 526/164 |
| 8,889,235 | B2 | 11/2014 | Mallikarjunan et al. | |
| 9,373,501 | B2 | 6/2016 | Ando et al. | |
| 2002/0127883 | A1 | 9/2002 | Conti et al. | |
| 2004/0194703 | A1 | 10/2004 | Shenai-khatkhate et al. | |
| 2009/0162973 | A1 | 6/2009 | Gatineau et al. | |
| 2011/0036289 | A1 | 2/2011 | Carothers et al. | |
| 2011/0084308 | A1 | 4/2011 | Loh et al. | |
| 2013/0230975 | A1 | 9/2013 | Kakimoto et al. | |
| 2014/0331928 | A1 | 11/2014 | Kakimoto et al. | |
| 2015/0245355 | A1 | 8/2015 | Kim et al. | |
| 2015/0275355 | A1 | 10/2015 | Mallikarjunan et al. | |
| 2020/0291321 | A1 | 9/2020 | Kim et al. | |
| 2020/0377636 | A1 | 12/2020 | Rössle et al. | |

FOREIGN PATENT DOCUMENTS

| | | | |
|---|---|---|---|
| CN | 101886255 | A | 11/2010 |
| CN | 110872700 | A | 3/2020 |
| EP | 1464724 | A2 | 10/2004 |
| JP | 2010118664 | A | 5/2010 |
| JP | 2012124492 | A | 6/2012 |
| JP | 2013082986 | A | 5/2013 |
| JP | 2013236073 | A | 11/2013 |
| KR | 20080046014 | A | 5/2008 |
| TW | 201224193 | A | 6/2012 |

(Continued)

OTHER PUBLICATIONS

Fama, Silvia, et al. "High Performance Germanium-on-Silicon Detectors for Optical Communications." Applied Physics Letters 81, 586-588 (2002) https://doi.org/10.1063/1.1496492.

Hair, Michael L., et al. "Reactions of Chlorosilanes With Silica Surfaces." Research and Development Laboratories, Corning Glass Works, Corning, NY 14830.

Miao, Qian Jiang, et al. "Silica-Supported Karstedt-Type Catalyst for Hydrosilylation Reactions." Institute of Polymer Composites, Zhejiang University. Published online Nov. 13, 2003.

Zapilko, Clemens, et al. "Advanced Surface Functionalization of Periodic Mesoporous Silica: Kinetic Control by Trisilazane Reagents." Kjemisk Institutt, Universitetet i Bergen. Aug. 7, 2006.

(Continued)

*Primary Examiner* — Kamal A Saeed
(74) *Attorney, Agent, or Firm* — David K. Benson; Versum Materials US, LLC

(57) ABSTRACT

Precursors and methods for (a) forming silicon-containing films and (b) functionalizing substrate surfaces in order to generate a germanium seed layer suitable for deposition of Ge films. In one aspect, there is provided a precursor of Formula I and/or a precursor of Formula II:

I

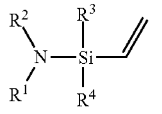

II

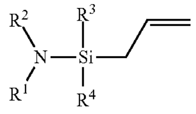

as described herein.

11 Claims, 1 Drawing Sheet

(56) References Cited

FOREIGN PATENT DOCUMENTS

WO 2022020705 A1 1/2022

OTHER PUBLICATIONS

"Extended European Search Report received for European Patent Application No. 21846582.1 mailing date Dec. 7, 2024", 8 Pages.
Fang, et al., "Theoretical design and computational screening of precursors for atomic layer deposition", Coordination Chemistry Reviews, vol. 322, Sep. 1, 2016, pp. 94-103.
"International Preliminary Report on Patentability received for PCT Application No. PCT/US2021/042946, mailing date Feb. 2, 2023", 6 Pages.
"International Search Report and Written Opinion received for PCT Application No. PCT/US2021/042946, mailing date Nov. 17, 2021", 9 Pages.

* cited by examiner

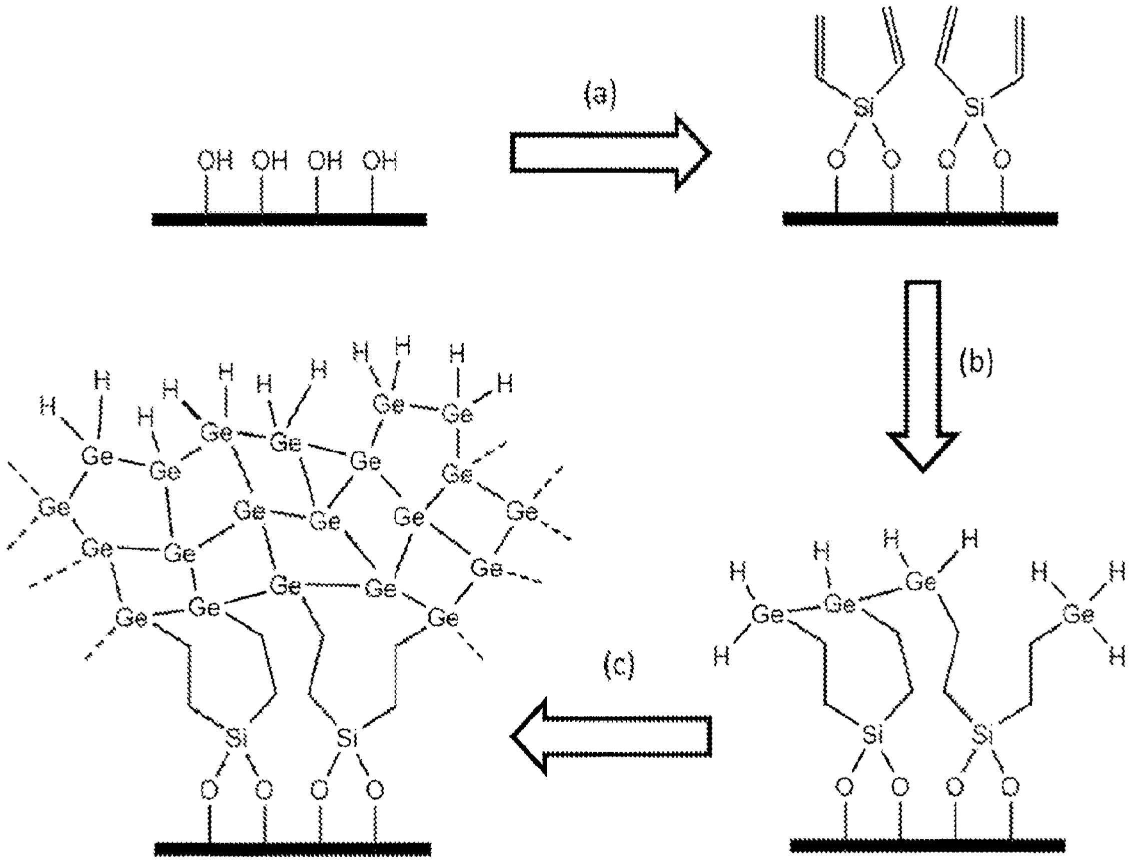
(a)
(b)
(c)

COMPOSITIONS AND METHODS USING SAME FOR GERMANIUM SEED LAYER

CROSS-REFERENCE TO RELATED APPLICATIONS

This application is a National Stage filing under 35 U.S.C. 371 of International Patent Application No. PCT/US2021/042946 filed Jul. 23, 2021, which claims priority to the U.S. Application No. 63/056,341 filed on Jul. 24, 2020. The entire contents of these applications are incorporated herein by reference in their entirety.

BACKGROUND OF THE INVENTION

The invention relates to organosilicon compounds that can be used to deposit silicon-containing films and generate vinyl-functionalized surfaces suitable for producing germanium seed layers that are advantageous for growing high quality reduced or metallic germanium films on solid substrate surfaces. The invention also relates to methods for using the compounds.

Described herein are novel organoamino-vinylsilane and organoamino-allylsilane precursor compounds and compositions and methods comprising the same to deposit a silicon-containing film such as, without limitation, silicon oxide, silicon oxynitride, silicon oxycarbonitride, or carbon-doped silicon oxide via a thermal atomic layer deposition (ALD) or plasma enhanced atomic layer deposition (PEALD) process, or a combination thereof. More specifically, described herein is a composition and method for formation of a stoichiometric or a non-stoichiometric silicon-containing film or material at one or more deposition temperatures of about 600° C. or less including, for example, from about 25° C. to about 350° C., wherein the resulting film is terminated with vinyl functional groups and suitable for forming a germanium seed layer.

One of the long-standing problems of Plasma Enhanced Chemical Vapor Deposition (PECVD) or thermal Chemical Vapor Deposition (CVD) of germanium films on dielectric substrates such as a silicon oxide surface using germane and digermane is that the reactivity of germane compounds with substrate surface hydroxy groups is much less than the reactivity of the decomposition of Ge—H bonds in the formation of Ge—Ge bond formation. The consequence of this reactivity mismatch is to form germanium mass islands instead of smooth films on the substrate. To overcome this "island effect" or "island growth", which leads to high levels of surface roughness of the resulting germanium film, a smooth seed layer is necessary to be initially laid down on the surface, which provides a smooth starting surface and allows the subsequent germanium films to grow uniformly. However, the growth of this seed layer using typical PECVD or CVD germanium precursors on dielectric substrate surfaces still suffers from the typical drawbacks of CVD such as thickness control, low selectivity for dielectric surfaces, non-self-limiting reactivity, and low conformality.

Examples of known precursors and methods are disclosed in the following publications, patents, and patent applications.

Publication no. EP1464724A2 discloses silicon- and germanium-containing precursors having the formula $MX_aH_b(NR^1R^2)_cR^3_dR^4_e$ suitable for chemical vapor deposition of silicon and germanium films.

Famá, S et al., *Appl. Phys. Lett.* 2002, 81, 586 describes the epitaxial growth of germanium on silicon by first depositing a thin Ge/Si buffer layer with $GeH_4$ by chemical vapor deposition at 350° C. followed by chemical vapor deposition of a thicker germanium film at 600° C. for the purpose of fabricating p-i-n photodetectors.

Hair, M. L. et al., *Phys. Chem.* 1969, 73, 2372 reports the functionalization of silica with chlorosilanes, which occurs in the vapor phase at a satisfactory rate between 300-400° C. as compared to methoxysilanes (100-200° C.).

Miao, Q. J. et al., *Catal. Commun.* 2003, 4, 637 describes the treatment of fumed silica with vinyltriethoxysilane in toluene under refluxing conditions for 48 hours followed by reaction with water for another 48 hours to functionalize the surface with vinyl groups.

Zapilko, C. et al., *J. Am. Chem. Soc.* 2006, 128, 16266 describes the functionalization of periodic mesoporous silica with chloropropyldimethylsilyl groups and vinyldimethylsilyl groups by treating it with a vinyl-substituted trisilylamine in toluene at 109° C. for 15 hours.

U.S. Pat. No. 8,460,753 B2 describes precursors and methods to deposit silicon dioxide or silicon oxide films by ALD or CVD, wherein the precursors are aminovinylsilanes having the formula $R^1_nR^2_mSi(NR^3R^4)_{4-n-m}$ and cyclic silazanes having the formula $(R^1R^2SiNR^3)_p$, wherein $R^1$ is an alkenyl or an aromatic, such as vinyl, allyl, and phenyl.

US Pub. No. 20150275355 A1 describes compositions and methods for forming silicon oxide films using precursors having the formula $R^1_nSi(NR^2R^3)_mH_{4-m-n}$, more specifically using organoamino-methylsilane precursors.

US Pub. No. 20090162973 A1 describes the deposition of germanium films or germanium antimony telluride films on a substrate using germanium containing precursors having the formula $GeR_x^1(NR^2R^3)_{(4-x)}$, wherein the method involves exposing the substrate to the germanium containing precursor alone or in conjunction with either an oxidizing gas or reducing gas.

US Pub. No. 20110036289 A1 describes a method of depositing a germanium seed layer via CVD on a hydrogen-treated silicon substrate using $GeH_4$ precursor at low temperature, followed by subsequent growth of either an n-doped or p-doped germanium epitaxial film using $GeH_4$ precursor in the presence of either phosphine or diborane, respectively, at elevated temperatures.

US Pub. No. 20110084308 A1 discloses a method of selectively growing high quality strained or strain-relaxed Ge on patterned Si substrate, which involves the growth of a silicon-germanium buffer layer first via CVD with $Si_2H_6$ and $GeH_4$ precursors at 350-400° C., followed by the growth of a Ge seed layer via CVD with $GeH_4$ precursor at 350-400° C., followed by the growth of Ge epitaxy film via CVD with $GeH_4$ precursor at 550-600° C.

US Pub. Nos. 20130230975 A1 and 20140331928 A1 both describe the use of an aminogermane-based gas to form a germanium seed layer on a substrate followed by growth of a germanium thin film using a germane-based gas.

The disclosure of the previously identified patents and patent applications is hereby incorporated by reference.

There is still a need in this art for precursors and methods for depositing a smooth, high quality reduced or metallic germanium film on dielectric substrate surfaces.

In contrast to the prior art, the seed layer precursor in the invention disclosed herein utilizes silicon-amine functional groups as anchor groups to connect vinyl groups or allyl groups to the surface. This chemistry converts a hydroxyl rich surface into a vinyl or allyl rich surface. Then, germane or digermane or another germanium precursor having at least one Ge—H bond will be introduced to the chamber and will react with the vinyl and/or allyl groups in a hydrogermylation reaction and form carbon bonded germyl or digermyl groups on the surface. The consequent germanium film deposited using a germanium precursor will grow instantly on this germyl rich surface without formation of islands.

BRIEF SUMMARY OF THE INVENTION

Described herein are silicon precursors of the organoamino-vinylsilane and organoamino-allylsilane families comprising at least one vinyl or allyl group and at least one organoamino anchoring group, compositions comprising the same, and methods using the same for depositing a silicon-containing film as well as forming a monolayer film comprising silicon and vinyl groups, which can facilitate the formation of a suitable seed layer for the deposition of metallic thin films, specifically germanium thin films. In addition, described herein is a composition comprising an organoamino-vinylsilane or an organoamino-allylsilane that is substantially free of at least one impurity species selected from organoamines, alcohols, halides, higher molecular weight species, and trace metals. The composition may further comprise a solvent. Also disclosed herein are methods to form films or coatings comprising silicon and vinyl groups on an object to be processed, such as a semiconductor wafer.

In one embodiment of the method described herein, a film comprising silicon and vinyl groups is deposited onto a substrate using an organoamino-vinylsilane or an organoamino-allylsilane precursor in a deposition chamber under conditions for generating a vinyl-terminated layer suitable for growing a germanium seed layer and subsequently a high quality germanium film.

More particularly, the above objects and others are accomplished by a method for forming a germanium seed layer, including the steps of:

a. providing a substrate in a reactor;
b. introducing into the reactor at least one precursor represented by Formula I and/or II;

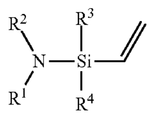

I

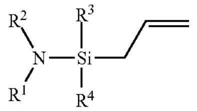

II wherein $R^1$ is selected from the group consisting of a linear or branched $C_1$ to $C_{10}$ alkyl group, a linear or branched $C_3$ to $C_{10}$ alkenyl group, a linear or branched $C_3$ to $C_{10}$ alkynyl group, a $C_3$ to $C_{10}$ cyclic alkyl group, and a $C_6$ to $C_{10}$ aryl group; $R^2$ is selected from the group consisting of hydrogen, a linear or branched $C_1$ to $C_{10}$ alkyl group, a linear or branched $C_2$ to $C_6$ alkenyl group, a linear or branched $C_3$ to $C_6$ alkynyl group, a $C_3$ to $C_{10}$ cyclic alkyl group, and a $C_6$ to $C_{10}$ aryl group; $R^3$ and $R^4$ are each independently selected from the group consisting of hydrogen, a linear or branched $C_1$ to $C_{10}$ alkyl group, a linear or branched $C_2$ to $C_6$ alkenyl group, a linear or branched $C_3$ to $C_6$ alkynyl group, a $C_3$ to $C_{10}$ cyclic alkyl group, a $C_6$ to $C_{10}$ aryl group, a $C_1$ to $C_{10}$ linear, cyclic, or branched alkoxy group, an organoamino group ($NR^1R^2$) as defined above, and a halide selected from the group consisting of Cl, Br, and I c. purging the reactor with a purge gas;
d. introducing at least one germanium precursor comprising at least one Ge—H bond at a temperature such that the substrate is coated with at least one monolayer of germanium;
e. purging the reactor with a purge gas;
f. optionally introducing hydrogen or a hydrogen plasma source;
g. optionally purging the reactor with a purge gas;
h. introducing the same or a different germanium precursor as in step d at a temperature suitable to grow a film comprising germanium with a desired thickness.

In one embodiment of the method described herein, the germanium precursor having at least one Ge—H group includes, without limitation, one or more of trichlorogermane ($Cl_3GeH$), germane ($GeH_4$), digermane ($Ge_2H_6$), tert-butylgermane ($^tBuGeH_3$), phenylgermane, sec-butylgermane, iso-butylgermane, and benzylgermane. As a step in the method, according to one embodiment a film comprising silicon and oxygen is deposited onto a substrate using the organoamino-vinylsilane precursor of Formula I and/or the organoamino-allylsilane precursor of Formula II and an oxygen-containing source under conditions for generating a silicon oxide or carbon doped silicon oxide film on the substrate. As a step in the method, according to another embodiment a film comprising silicon and nitrogen is deposited onto a substrate using the organoamino-vinylsilane precursor of Formula I and/or the organoamino-allylsilane precursor of Formula II and a nitrogen-containing source under conditions for generating a silicon nitride, carbon-doped silicon nitride, silicon oxynitride, or silicon oxycarbonitride film on the substrate. In a further embodiment, the organoamino-vinylsilane precursor according to Formula I and/or the organoamino-allylsilane precursor of Formula II are used as a dopant for metal containing films, such as but not limited to, metal oxide films or metal nitride films.

In certain embodiments of the above method, steps d and h may be performed at the same temperature, or step d may be performed at a temperature lower than step h as to avoid or limit CVD of germanium film in step d until a sufficient Ge seed layer has been formed. In some embodiments, step d is performed at a temperature higher than step h. In other embodiments, the temperature is increased after step d in order for the at least one monolayer of germanium, known as the seed layer, to be annealed thermally or during the optional hydrogen or hydrogen plasma treatment prior to deposition of the subsequent germanium CVD film in step g. In yet another embodiment, the at least one germanium precursor comprising at least one Ge—H bond is the same as the germanium CVD precursor. In other embodiments, the at least one germanium precursor comprising at least one Ge—H bond is not the same as the germanium CVD precursor.

In another aspect, there is provided a method of functionalizing the surface of a solid substrate such as, without limitation, silica, alumina, metal oxide, silicon wafer, dielectric thin film, or a metal surface with vinyl and/or allyl groups, the method comprising the steps of:

a. providing a substrate in a reactor;
b. introducing into the reactor at least one organoamino-vinylsilane precursor comprising at least one vinyl group and at least one organoamino anchoring group connected to at least one silicon atom represented by the following Formula I and/or at least one organoamino-allylsilane precursor comprising at least one allyl group and at least one organoamino anchoring group connected to at least one silicon atom represented by the following Formula II; and c. removing residual organoamino-vinylsilane or organoamino-allylsilane from the substrate with solvent and/or purge gas.

In some embodiments, the organoamino-vinylsilane and/or organoamino-allylsilane precursors disclosed herein may be introduced to the solid substrate as a neat liquid, as a solution in solvent, or in the vapor phase with or without a carrier gas at temperatures ranging from 0° C. to 500° C.

BRIEF DESCRIPTION OF THE DRAWINGS

FIG. 1 is a flow diagram that depicts a general scheme in which the organoamino-vinylsilane precursors having Formula I (or alternatively Formula II) as disclosed herein are used to (a) functionalize a substrate surface with vinyl groups, making it suitable for (b) the formation of a germanium seed layer via hydrogermylation reaction with a germanium precursor comprising at least one Ge—H bond, allowing for (c) the subsequent growth of a smooth and uniform germanium film on top of that seed layer using at least one ALD or CVD Ge precursor.

DETAILED DESCRIPTION OF THE INVENTION

Disclosed herein are silicon precursor compounds and methods of using the same for the deposition of silicon containing films as well as the functionalization of substrate surfaces for subsequent processing, including, but not limited to, the deposition of germanium films.

A particular method for forming a germanium seed layer includes the steps of:

a. providing a substrate in a reactor;

b. introducing into the reactor at least one organoamino-vinylsilane precursor comprising at least one vinyl group and at least one organoamino anchoring group connected to at least one silicon atom represented by Formula I and/or at least one organoamino-allylsilane precursor comprising at least one allyl group and at least one organoamino anchoring group connected to at least one silicon atom represented by the following Formula II;

I

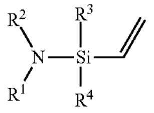

II

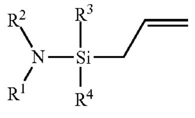

wherein $R^1$ is selected from the group consisting of a linear or branched $C_1$ to $C_{10}$ alkyl group, a linear or branched $C_3$ to $C_{10}$ alkenyl group, a linear or branched $C_3$ to $C_{10}$ alkynyl group, a $C_3$ to $C_{10}$ cyclic alkyl group, and a $C_6$ to $C_{10}$ aryl group; $R^2$ is selected from the group consisting of hydrogen, a linear or branched $C_1$ to $C_{10}$ alkyl group, a linear or branched $C_2$ to $C_6$ alkenyl group, a linear or branched $C_3$ to $C_6$ alkynyl group, a $C_3$ to $C_{10}$ cyclic alkyl group, and a $C_6$ to $C_{10}$ aryl group; $R^3$ and $R^4$ are each independently selected from the group consisting of hydrogen, a linear or branched $C_1$ to $C_{10}$ alkyl group, a linear or branched $C_2$ to $C_6$ alkenyl group, a linear or branched $C_3$ to $C_6$ alkynyl group, a $C_3$ to $C_{10}$ cyclic alkyl group, a $C_6$ to $C_{10}$ aryl group, a $C_1$ to $C_{10}$ linear, cyclic, or branched alkoxy group, an organoamino group ($NR^1R^2$) as defined above, and a halide selected from the group consisting of Cl, Br, and I c. purging the reactor with a purge gas;

d. introducing at least one germanium precursor comprising at least one Ge—H bond at a temperature such that the substrate is coated with at least one monolayer of germanium;

e. purging the reactor with a purge gas;

f. optionally introducing hydrogen or a hydrogen plasma source;

g. optionally purging the reactor with a purge gas; and h. introducing the same or a different germanium precursor as in step d at a temperature suitable to grow a film comprising germanium with a desired thickness.

In some embodiments, $R^1$ and $R^2$ are the same. In other embodiments, $R^1$ and $R^2$ are different. In some embodiments, $R^3$ and $R^4$ are the same. In other embodiments, $R^3$ and $R^4$ are different.

In some preferred embodiments, $R^3$ and $R^4$ are independently selected from the group consisting of hydrogen, methyl, vinyl, and allyl.

The organoamino-vinylsilane and organoamino-allylsilane precursors described herein are used to form monolayer films containing silicon plus vinyl and/or allyl groups as well as stoichiometric and non-stoichiometric silicon containing films such as, but not limited to, amorphous silicon, crystalline silicon, silicon oxide, carbon-doped silicon oxide, silicon oxycarbide, silicon nitride, silicon oxynitride, and silicon oxycarbonitride. These precursors can also be used, for example, as dopants for metal containing films. The organoamino-vinylsilane and organoamino-allylsilane precursors used in semi-conductor processes are typically high purity volatile liquid chemicals that are vaporized and delivered to a deposition chamber or reactor as a gas to deposit a silicon containing film via CVD or ALD processes for semiconductor devices, however, they can also be introduced to substrates in the liquid phase (either neat or with a solvent). The selection of precursor materials for deposition depends upon the desired resultant silicon-containing material or film. For example, a precursor material may be chosen for its content of chemical elements, its stoichiometric ratios of the chemical elements, and/or the resultant silicon containing film or coating that are formed under CVD. The precursor material may also be chosen for various other characteristics such as cost, relatively low toxicity, handling characteristics, ability to maintain liquid phase at room temperature, volatility, molecular weight, thermal stability, and/or other considerations. In certain embodiments, the precursors described herein can be delivered to the reactor system by any number of means, preferably using a pressurizable stainless steel vessel fitted with the proper valves and fittings, to allow the delivery of liquid or vapor phase precursor to the deposition chamber or reactor.

Another particular method for forming a germanium seed layer includes the steps of:

a. providing a substrate in a reactor;

b. introducing into the reactor at least one organoamino-vinylsilane precursor comprising at least one vinyl group and at least one organoamino anchoring group connected to at least one silicon atom represented by Formula I and/or at least one organoamino-allylsilane precursor comprising at least one allyl group and at least one organoamino anchoring group connected to at least one silicon atom represented by the following Formula II;

I

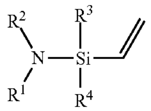

II

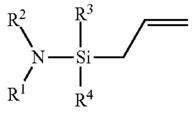

wherein $R^1$ is selected from the group consisting of a linear or branched $C_1$ to $C_{10}$ alkyl group, a linear or branched $C_3$ to $C_{10}$ alkenyl group, a linear or branched $C_3$ to $C_{10}$ alkynyl group, a $C_3$ to $C_{10}$ cyclic alkyl group, and a $C_6$ to $C_{10}$ aryl group; $R^2$ is selected from the group consisting of hydrogen, a linear or branched $C_1$ to $C_{10}$ alkyl group, a linear or branched $C_2$ to $C_6$ alkenyl group, a linear or branched $C_3$ to $C_6$ alkynyl group, a $C_3$ to $C_{10}$ cyclic alkyl group, and a $C_6$ to $C_{10}$ aryl group; $R^3$ and $R^4$ are each independently selected from the group consisting of hydrogen, a linear or branched $C_1$ to $C_{10}$ alkyl group, a linear or branched $C_2$ to $C_6$ alkenyl group, a linear or branched $C_3$ to $C_6$ alkynyl group, a $C_3$ to $C_{10}$ cyclic alkyl group, a $C_6$ to $C_{10}$ aryl group, a $C_1$ to $C_{10}$ linear, cyclic, or branched alkoxy group, an organoamino group ($NR^1R^2$) as defined above, and a halide selected from the group consisting of Cl, Br, and I c. purging the reactor with a purge gas;
d. introducing an oxygen-containing source;
e. purging the reactor with a purge gas;
f. reintroducing the organoamino-vinylsilane or organoamino-allylsilane precursor described above;
g. purging the reactor with a purge gas;
h. introducing at least one germanium precursor comprising at least one Ge—H bond at a temperature such that the substrate is coated with at least one monolayer of germanium;
i. purging the reactor with a purge gas;
j. optionally introducing hydrogen or a hydrogen plasma source;
k. optionally purging the reactor with a purge gas; and
l. introducing the same or a different germanium precursor as in step d at a temperature suitable to grow a film comprising germanium with a desired thickness; wherein steps b through e are repeated until a silicon-containing film of desired thickness is deposited prior to deposition of the germanium seed layer and subsequent germanium containing film.

In some embodiments, $R^1$ and $R^2$ are the same. In other embodiments, $R^1$ and $R^2$ are different. In some embodiments, $R^3$ and $R^4$ are the same. In other embodiments, $R^3$ and $R^4$ are different.

In some preferred embodiments, $R^3$ and $R^4$ are independently selected from the group consisting of hydrogen, methyl, vinyl, and allyl.

The silicon containing films deposited using the organoamino-vinylsilane and/or organoamino-allylsilane precursors described herein, whether a single monolayer or greater than a single monolayer, can serve as substrates suitable for reaction with germanium precursors comprising at least one Ge—H bond. Without being bound by theory, it is believed that when the surface of the substrate is reacted with the organoamino-vinylsilane and/or organoamino-allylsilane precursors described herein, it becomes functionalized with vinyl and/or allyl groups, or more specifically vinylsilyl and/or allylsilyl groups. These groups can each subsequently undergo a hydrogermylation reaction with a Ge—H bond of a germanium precursor molecule, thus anchoring a germanium atom or germyl group onto the surface wherever there is an available vinyl and/or allyl group. The vinyl and/or allyl group in this reaction is converted to an ethylene, ethylidene, propylene, or methylethylene linker between Si and Ge atoms. Once the surface of the substrate is coated uniformly with germyl groups, it becomes primed for deposition of Ge films by ALD, PEALD, CVD, cyclic CVD, or PECVD processes, in most cases at elevated temperature, but in some cases at the same temperature. In some embodiments, the germyl groups anchored on the surface must first be reduced with reducing gas such as, without limitation, hydrogen or hydrogen plasma, to create a —$GeH_x$ (x=0, 1, 2, 3) terminated surface.

Exemplary germanium precursors comprising at least one Ge—H bond include, but are not limited to, one or more of trichlorogermane ($Cl_3GeH$), germane ($GeH_4$), digermane ($Ge_2H_6$), tert-butylgermane ($^tBuGeH_3$), phenylgermane, sec-butylgemane, iso-butylgermane, and benzylgermane FIG. 1 depicts a general scheme in which the organoamino-vinylsilane precursors having Formula I as disclosed herein are used to (a) functionalize a substrate surface with vinyl groups, making it suitable for (b) the formation of a germanium seed layer via hydrogermylation reaction with a germanium precursor comprising at least one Ge—H bond, allowing for (c) the subsequent growth of a smooth and uniform germanium film on top of that seed layer using at least one ALD or CVD Ge precursor. The same type of scheme applies to methods in which organoamino-allylsilane precursors having Formula II as disclosed herein are used in step (a) of FIG. 1, except that the substrate would be functionalized with allyl groups instead of vinyl groups.

It is believed that when a substrate is terminated uniformly with —$GeH_x$ (x=0, 1, 2, 3) groups as a result of previously treating it uniformly with organoamino-vinylsilane and/or organoamino-allylsilane precursors disclosed herein, it will serve as a seed layer, which allows subsequent growth of either amorphous or crystalline germanium films with very low non-uniformity and low levels of surface roughness. The resulting smooth and uniform Ge film is thought to be enabled by eliminating a phenomenon known to those skilled in the art as "island growth" in the beginning of the Ge film deposition. By converting an unreactive organic, dielectric, metallic, or any other unreactive surface to a reactive surface functionalized with germanium atoms or germyl groups, one can begin to deposit Ge films without the formation of "islands" on the surface. This smooth, conformal initial layer is characteristic of a high quality germanium seed layer.

The organoamino-vinylsilane and organoamino-allylsilane precursors described herein exhibit a balance of reactivity and stability that makes them ideally suitable as CVD or ALD precursors in microelectronic device manufacturing processes. With regard to reactivity, the organoamino-vinylsilanes and/or organoamino-allylsilanes in this invention have at least one organoamino group ($NR^1R^2$) which helps react the organoamino-vinylsilane and/or organoamino-allylsilane precursors with a hydroxyl surface during an ALD process. Although the hydroxyl surfaces most often referred to in this invention are dielectric surfaces such as silicon oxide, silicon nitride, silicon (with native oxide), metal oxides, metal nitrides, or metal (with native oxide), other materials that may contain surface hydroxyl groups such as, for example, organic polymers, silicones, resins, plastics, beads, adsorbents, amorphous carbon, activated charcoal, minerals, organic matter, containers, and textiles are also expected to be reactive toward the at least one organoamino group on the organoamino-vinylsilane and/or the organoamino-allylsilane precursors described herein.

The organoamino anchoring group in the organoamino-vinylsilane and organoamino-allylsilane precursors described herein are expected to provide an advantage over chloro-vinylsilane, alkoxy-vinylsilane, vinyldisilazane, chloro-allylsilane, alkoxy-allylsilane, and allyl-disilazane precursors in regard to reaction with —OH terminated surfaces, especially at low temperatures and in the vapor phase. For example, treating a substrate with triethoxyvinylsilane at a certain temperature may functionalize little to none of the substrate surface with vinyl groups, while treating the substrate with an organoamino-vinylsilane at the same temperature may provide a much higher level of functionalization. Similarly, treating a substrate with triethoxyallylsilane at a certain temperature may functionalize little to none of the substrate surface with allyl groups, while treating the substrate with an organoamino-allylsilane at the same temperature may provide a much higher level of functionalization. This makes the organoamino-vinylsilanes and organoamino-allylsilanes having Formulae I and II advantageous as surface modifiers for purposes other than subsequent deposition of germanium films. Examples of current processes that can benefit from a high saturation of surface vinyl and/or allyl groups include, without limitation, (a) immobilizing species such as catalysts, ion exchange functional groups, adsorbents, or metal scavengers onto a solid support; (b) increasing the hydrophobicity of a substrate; (c) changing the optical properties or refractive index of a substrate for display applications; and/or (d) providing cross-linking sites for better adhesion after UV/thermal annealing of a subsequent coating.

Certain precursors may have boiling points that are too high to be vaporized and delivered to the reactor to be deposited as a film on a substrate, so it is preferable to select smaller organoamino groups as well as smaller R-groups to provide precursors having boiling points of 250° C. or less, preferably boiling points of 200° C. or less. Having two or more organoamino groups can increase the boiling point significantly; precursors having higher relative boiling points require that the delivery container and lines need to be heated at or above the boiling point of the precursor under a given vacuum to prevent condensation or particles from forming in the container, lines, or both. With regard to stability, other precursors may form silane ($SiH_4$) or disilane ($Si_2H_6$) as they degrade. Silane is pyrophoric at room temperature or it can spontaneously combust which presents safety and handling issues. Moreover, the formation of silane or disilane and other by-products decreases the purity level of the precursor, and changes as small as 1-2% in chemical purity may be considered unacceptable for reliable semiconductor manufacture. In certain embodiments, the organoamino-vinylsilane and/or organoamino-allylsilane precursors having Formula I and/or II described herein comprise 2% or less by weight, or 1% or less by weight, or 0.5% or less by weight of impurities (such as free organoamine, alcohol, chlorosilane, halide, or higher molecular weight disproportionation products) after being stored for a time period of 6 months or greater, or one year or greater which is indicative of being shelf stable. Certain organoamino-vinylsilane and/or organoamino-allylsilane precursors having an Si—H group (at least one of $R^3$ and $R^4$ in Formula I and/or II is hydrogen) may be prone to degradation via polymerization thru intermolecular hydrosilylation reaction. That is, a reaction may occur between an Si—H group of one molecule and the vinyl and/or allyl group of another molecule if the size of the $R^1$ thru $R^4$ groups in Formula I and/or II do not provide enough steric protection. This hydrosilylation reaction may occur either slowly or spontaneously under storage conditions, or during purification (e.g. distillation), or during a deposition process and can be catalyzed by trace impurities. Therefore, it is important to rid the organoamino-vinylsilane precursor of as many impurities as possible which may act as hydrosilylation/polymerization catalysts. Also, careful selection of the $R^1$ thru $R^4$ groups is required to allow facile reaction of the organoamino-vinylsilane and/or organoamino-allylsilane with the substrate surface under the desired conditions, while preserving innate stability of the precursor.

In certain preferred embodiments, $R^3$ and $R^4$ in Formula I and/or II are both organoamino groups. In other preferred embodiments, $R^3$ and $R^4$ in Formula I and/or II are both methyl groups. In other preferred embodiments, $R^{1-4}$ in Formula I and/or II are all methyl groups. In other preferred embodiments, $R^3$ and $R^4$ in Formula I and/or II are both vinyl groups. In other preferred embodiments, $R^3$ and $R^4$ in Formula I and/or II are both allyl groups. In other preferred embodiments, $R^3$ is an organoamino group, and $R^4$ is a vinyl group in Formula I. In other preferred embodiments, $R^3$ is an organoamino group, and $R^4$ is an allyl group in Formula II. In other preferred embodiments, $R^3$ is a methyl group and $R^4$ is a vinyl group in Formula I. In other preferred embodiments, $R^3$ is a methyl group and $R^4$ is an allyl group in Formula II.

In certain embodiments, such as for depositing a silicon oxide or silicon nitride or other silicon containing film using an ALD, ALD-like, PEALD, or CCVD deposition method, the organoamino-vinylsilane and organoamino-allylsilane precursors described herein are able to deposit high density materials at relatively low deposition temperatures, e.g., 1000° C. or less, 800° C. or less, 700° C. or less, 500° C. or less, or 400° C. or less, 300° C. or less, 200° C. or less, 100° C. or less, or 50° C. or less.

In one embodiment, described herein is a composition for forming a silicon-containing film comprising: an organoamino-vinylsilane having Formula I and/or an organoamino-allylsilane having Formula II described herein and a solvent(s).

Without intending to be bound by any particular theory, it is believed that the composition described herein may provide one or more advantages compared to existing silicon precursors such as TEOS, BDEAS, $SiCl_4$. These advantages include: better usage of the organoamino-vinylsilane and/or organoamino-allylsilane in semiconductor processes, better stability over long term storage, cleaner evaporation by flash vaporization, and/or overall more stable direct liquid injection (DLI) chemical vapor deposition process, allowing for deposition of higher quality silicon-containing films, furthermore allowing for more superior subsequent Ge film deposition. The weight percentage of the organoamino-vinylsilane and/or organoamino-allylsilane in the composition can range from 1 to 99% with the balance being solvent(s), wherein the solvent(s) does not react with the organoamino-vinylsilane and/or organoamino-allylsilane and has a boiling point similar to the organoamino-vinylsilane and/or organoamino-allylsilane. With regard to the latter, the difference between the boiling points of the organoamino-vinylsilane and/or organoamino-allylsilane and solvent(s) in the composition is 40° C. or less, more preferably 20° C. or less, or 10° C. or less.

In some embodiments, it is advantageous to use the organoamino-vinylsilane and/or organoamino-allylsilane precursors described in this invention to deposit a silicon-containing film such as, without limitation, silicon, silicon carbide, silicon nitride, carbon-doped silicon nitride, silicon oxide, silicon oxynitride, carbon-doped silicon oxynitride, and carbon-doped silicon oxide, providing that a metallic film such as a germanium film is to be subsequently deposited onto that silicon-containing film. Without intending to be bound by a particular theory, it is believed that when the final step of this Si-containing film deposition process is the organoamino-vinylsilane and/or organoamino-allylsilane precursor exposure, the resulting Si-containing film is much more susceptible to formation of a uniform Ge seed layer and thus smooth, conformal Ge film growth thereafter. In some cases, the bulk composition, physical properties, and electrical properties of the Si-containing films described herein might also be achieved using various other silicon precursors and deposition methods known in the prior art. However, those films would still require functionalization with the organoamino-vinylsilane and/or organoamino-allylsilane precursors described herein prior to deposition of reduced or metallic germanium films in order for those germanium films to be of the same high quality. It is therefore clear how using a single silicon precursor such as an organoamino-vinylsilane or organoamino-allylsilane described herein to perform both the deposition of a silicon-containing film as well as the functionalization of that film with vinyl and/or allyl groups for subsequent Ge film growth would be much more favorable to using two different silicon precursors.

In certain embodiments, substituents $R^1$ and $R^2$ in Formula I and/or II can be linked together to form a ring structure. As the skilled person will understand, where $R^1$ and $R^2$ are linked together to form a ring $R^1$ will include a bond for linking to $R^2$ and vice versa. In these embodiments, the ring structure can be unsaturated such as a cyclic alkyl ring, or saturated such as an aryl ring. In a similar manner, $R^3$ and $R^4$ in Formula I and/or II can be linked together to form a ring structure. Further, in these embodiments, the ring structure can also be substituted or unsubstituted. Exemplary cyclic ring groups include, but are not limited to, pyrrolidino, 2-methylpyrrolidino, 2,5,-dimethylpyrrolidino, piperidino, 2,6-dimethylpiperidino, pyrrolyl, and imidazolyl groups. In other embodiments, however, substituents $R^1$ and $R^2$ are not linked. In yet other embodiments, $R^3$ and $R^4$ are not linked.

In the formulae and throughout the description, the term "alkyl" denotes a linear, or branched functional group having from 1 to 10 or 1 to 6 carbon atoms. Exemplary alkyl groups include, but are not limited to, methyl, ethyl, propyl, isopropyl, butyl, isobutyl, sec-butyl, tert-butyl, pentyl, iso-pentyl, tert-pentyl, hexyl, iso-hexyl, and neo-hexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto.

In the formulae and throughout the description, the term "cyclic alkyl" denotes a cyclic functional group having from 3 to 10 or from 4 to 10 carbon atoms or from 5 to 10 carbon atoms. Exemplary cyclic alkyl groups include, but are not limited to, cyclobutyl, cyclopentyl, cyclohexyl, and cyclooctyl groups.

In the formulae and throughout the description, the term "aryl" denotes an aromatic cyclic functional group having from 5 to 12 carbon atoms or from 6 to 10 carbon atoms. Exemplary aryl groups include, but are not limited to, phenyl, benzyl, chlorobenzyl, tolyl, and o-xylyl.

In the formulae and throughout the description, the term "alkenyl group" denotes a group which has one or more carbon-carbon double bonds and has from 3 to 10 or from 3 to 6 or from 3 to 4 carbon atoms. Exemplary alkenyl groups include, but are not limited to, vinyl and allyl.

In the formulae and throughout the description, the term "alkynyl group" denotes a group which has one or more carbon-carbon triple bonds and has from 3 to 10 or from 3 to 6 or from 3 to 4 carbon atoms.

In the formulae and throughout the description, the term "organoamino group" denotes a group which has at least one alkyl or otherwise hydrocarbon group attached to a nitrogen atom and has from 1 to 10 or from 2 to 6 or from 2 to 4 carbon atoms.

Exemplary organoamino groups include, but not limited to, methylamino, ethylamino, normal-propylamine, iso-propylamino, normal-butylamino, iso-butylamino, sec-butylamino, tert-butylamino, cyclopentylamino, cyclohexylamino, phenylamino, dimethylamino, N-ethylmethylamino, diethylamino, di-iso-propylamino.

In the formulae and throughout the description, the term "dialkylamino group" denotes a group which has two alkyl groups attached to a nitrogen atom, wherein each alkyl group has, for example, from 1 to 10, from 2 to 6, or from 2 to 4 carbon atoms. Exemplary dialkylamino groups include, but limited to, dimethylamino, diethylamino, ethylmethylamino, di-normal-propylamine, di-iso-propylamino, di-normal-butylamino, di-iso-butylamino, di-sec-butylamino, di-tert-butylamino.

In certain embodiments, one or more of the alkyl group, alkenyl group, alkynyl group, or aryl group in Formula I and II may be substituted or have one or more atoms or group of atoms substituted in place of, for example, a hydrogen atom. Exemplary substituents include, but are not limited to, oxygen, sulfur, halogen atoms (e.g., F, Cl, I, or Br), nitrogen, and phosphorous.

In certain embodiments, the at least one organoamino-vinylsilane precursor having Formula I and/or the at least one organoamino-allylsilane precursors having Formula II has one or more substituents comprising oxygen or nitrogen atoms.

It is believed that the unique structures of the Formula I and II precursors described herein allow for deposition of silicon-containing films and/or surface functionalization of solid substrates at temperatures of 1000° C. or less, 700° C. or less, 500° C. or less, 400° C. or less, 300° C. or less, 200° C. or less, 100° C. or less, or 25° C. or less.

Table 1 lists examples of silicon precursors having at least one vinyl group and at least one organoamino anchoring group connected to at least one silicon atom according to Formula I.

TABLE 1

| Exemplary organoamino-vinylsilane precursors. |
| --- |
| 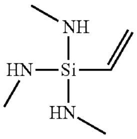 tris(methylamino)vinylsilane |

TABLE 1-continued

| Exemplary organoamino-vinylsilane precursors. |
|---|
| 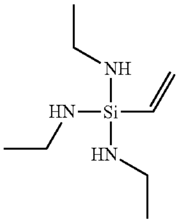 |
| tris(ethylamino)vinylsilane |
| 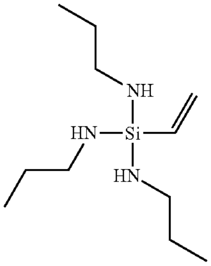 |
| tris(n-propylamino)vinylsilane |
| 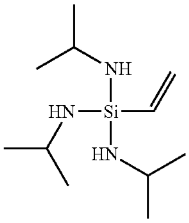 |
| tris(iso-propylamino)vinylsilane |
| 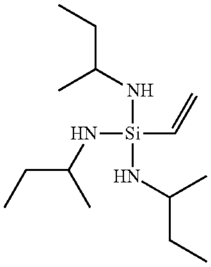 [SMILES: C=C[Si](NC(C)CC)(NC(C)CC)NC(C)CC] |
| tris(sec-butylamino)vinylsilane |
| 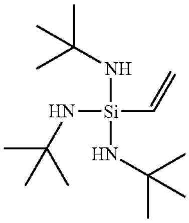 [SMILES: C=C[Si](NC(C)(C)C)(NC(C)(C)C)NC(C)(C)C] |
| tris(tert-butylamino)vinylsilane |

TABLE 1-continued

| Exemplary organoamino-vinylsilane precursors. |
|---|
| 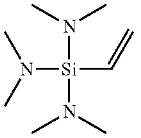 |
| tris(dimethylamino)vinylsilane |
| 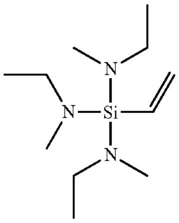 |
| tris(N-ethylmethylamino)vinylsilane |
| 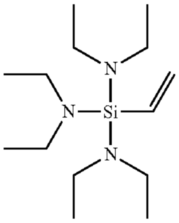 [SMILES: C=C[Si](N(CC)CC)(N(CC)CC)N(CC)CC] |
| tris(diethylamino)vinylsilane |
| 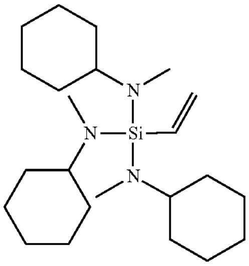 [SMILES: C=C[Si](N(C)C1CCCCC1)(N(C)C1CCCCC1)N(C)C1CCCCC1] |
| tris(N-methylcyclohexylamino)vinylsilane |
| 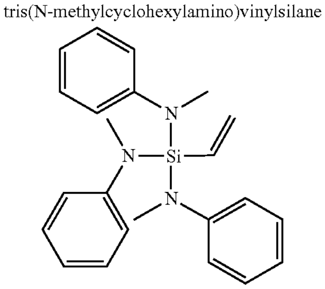 |
| tris(N-methylphenylamino)vinylsilane |
| 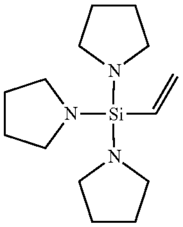 [SMILES: C=C[Si](N1CCCC1)(N1CCCC1)N1CCCC1] |
| tri(pyrrolidino)vinylsilane |

TABLE 1-continued

| Exemplary organoamino-vinylsilane precursors. |
| --- |
| 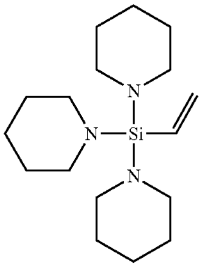 [SMILES: C=C[Si](N1CCCCC1)(N1CCCCC1)N1CCCCC1] tri(piperidino)vinylsilane |
| 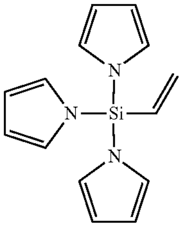 [SMILES: C=C[Si](n1cccc1)(n1cccc1)n1cccc1] tri(pyrrolyl)vinylsilane |
| 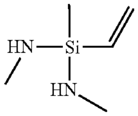 bis(methylamino)methylvinylsilane |
| 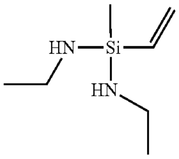 bis(ethylamino)methylvinylsilane |
| 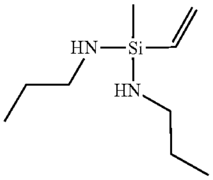 bis(n-propylamino)methylvinylsilane |
| 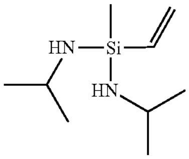 bis(iso-propylamino)methylvinylsilane |

TABLE 1-continued

| Exemplary organoamino-vinylsilane precursors. |
| --- |
| 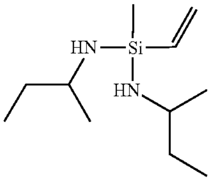 bis(sec-butylamino)methylvinylsilane |
| 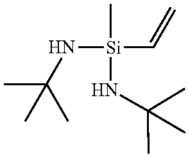 bis(tert-butylamino)methylvinylsilane |
| 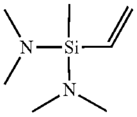 bis(dimethylamino)methylvinylsilane |
| 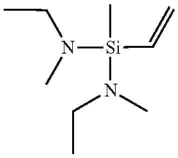 bis(N-ethylmethylamino)methylvinylsilane |
| 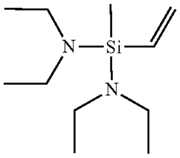 bis(diethylamino)methylvinylsilane |
| 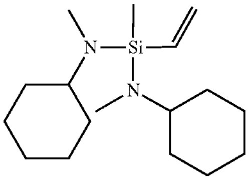 [SMILES: C=C[Si](C)(N(C)C1CCCCC1)N(C)C1CCCCC1] bis(N-methylcyclohexylamino)methylvinylsilane |
| 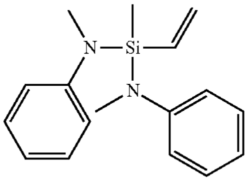 [SMILES: C=C[Si](C)(N(C)c1ccccc1)N(C)c1ccccc1] bis(N-methylphenylamino)methylvinylsilane |

TABLE 1-continued

| Exemplary organoamino-vinylsilane precursors. |
|---|
| 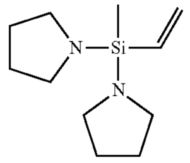 |
| di(pyrrolidino)methylvinylsilane |
| 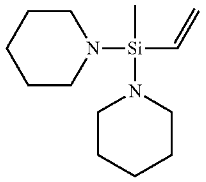 [SMILES: C=C[Si](C)(N1CCCCC1)N1CCCCC1] |
| di(piperidino)methylvinylsilane |
| 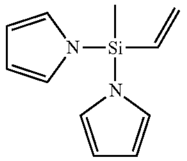 |
| di(pyrrolyl)methylvinylsilane |
| 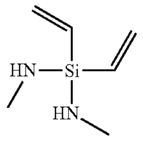 |
| bis(methylamino)divinylsilane |
| 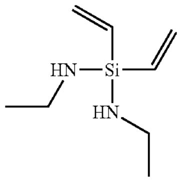 |
| bis(ethylamino)divinylsilane |
| 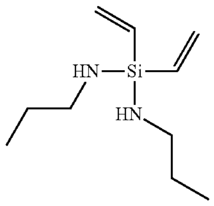 |
| bis(n-propylamino)divinylsilane |
| 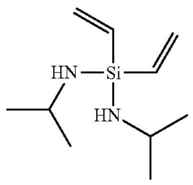 |
| bis(iso-propylamino)divinylsilane |

TABLE 1-continued

| Exemplary organoamino-vinylsilane precursors. |
|---|
| 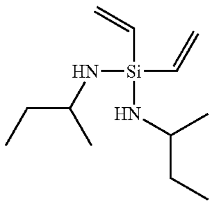 |
| bis(sec-butylamino)divinylsilane |
| 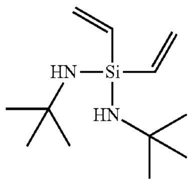 |
| bis(tert-butylamino)divinylsilane |
| 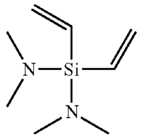 |
| bis(dimethylamino)divinylsilane |
| 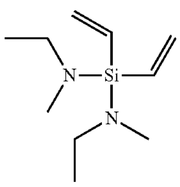 |
| bis(N-ethylmethylamino)divinylsilane |
| 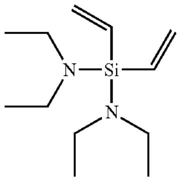 |
| bis(diethylamino)divinylsilane |
| 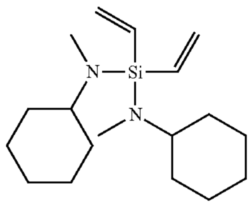 [SMILES: C=C[Si](C=C)(N(C)C1CCCCC1)N(C)C1CCCCC1] |
| bis(N-methylcyclohexylamino)divinylsilane |
| 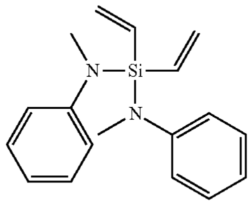 [SMILES: C=C[Si](C=C)(N(C)c1ccccc1)N(C)c1ccccc1] |
| bis(N-methylphenylamino)divinylsilane |

TABLE 1-continued

Exemplary organoamino-vinylsilane precursors.

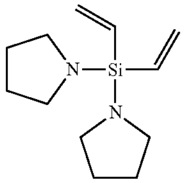

di(pyrrolidino)divinylsilane

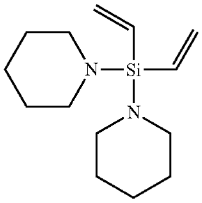 [SMILES: C=C[Si](C=C)(N1CCCCC1)N1CCCCC1]

di(piperidino)divinylsilane

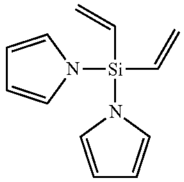

di(pyrrolyl)divinylsilane

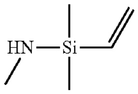

(methylamino)dimethylvinylsilane

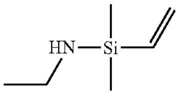

(ethylamino)dimethylvinylsilane

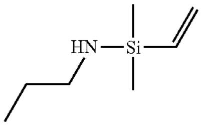

(n-propylamino)dimethylvinylsilane

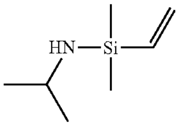

(iso-propylamino)dimethylvinylsilane

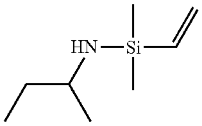

(sec-butylamino)dimethylvinylsilane

TABLE 1-continued

Exemplary organoamino-vinylsilane precursors.

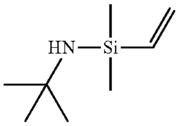

(tert-butylamino)dimethylvinylsilane

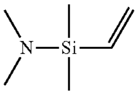

(dimethylamino)dimethylvinylsilane

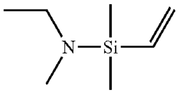

(N-ethylmethylamino)dimethylvinylsilane

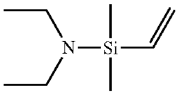

(diethylamino)dimethylvinylsilane

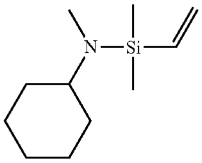

(N-methylcyclohexylamino)dimethylvinylsilane

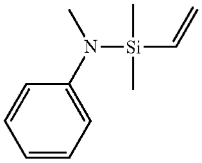

(N-methylphenylamino)dimethylvinylsilane

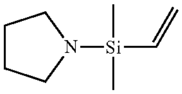

(pyrrolidino)dimethylvinylsilane

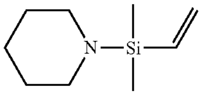

(piperidino)dimethylvinylsilane

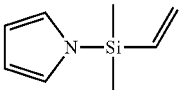

(pyrrolyl)dimethylvinylsilane

TABLE 1-continued

| Exemplary organoamino-vinylsilane precursors. |
|---|
| 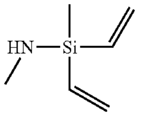<br>(methylamino)methyldivinylsilane |
| 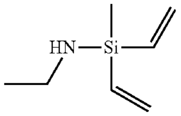<br>(ethylamino)methyldivinylsilane |
| 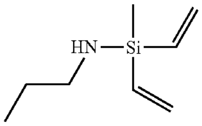<br>(n-propylamino)methyldivinylsilane |
| 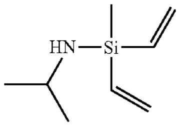<br>(iso-propylamino)methyldivinylsilane |
| 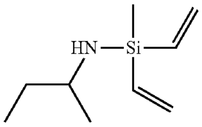<br>(sec-butylamino)methyldivinylsilane |
| 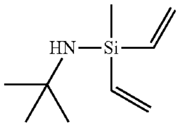<br>(tert-butylamino)methyldivinylsilane |
| 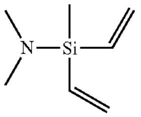<br>(dimethylamino)methyldivinylsilane |
| 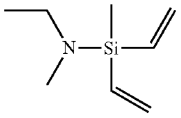<br>(N-ethylmethylamino)methyldivinylsilane |
| 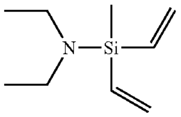<br>(diethylamino)methyldivinylsilane |
| 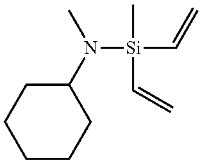<br>(N-methylcyclohexylamino)methyldivinylsilane |
| 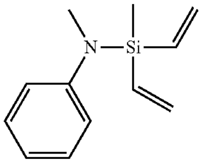<br>(N-methylphenylamino)methyldivinylsilane |
| 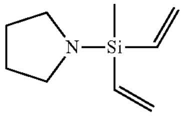<br>(pyrrolidino)methyldivinylsilane |
| 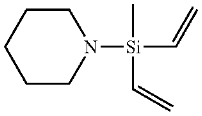<br>(piperidino)methyldivinylsilane |
| 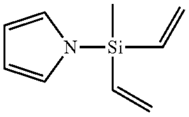<br>(pyrrolyl)methyldivinylsilane |
| 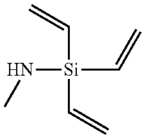<br>(methylamino)trivinylsilane |
| 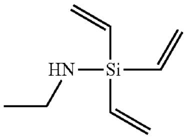<br>(ethylamino)trivinylsilane |
| 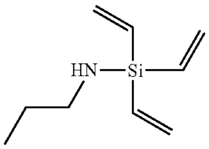<br>(n-propylamino)trivinylsilane |

TABLE 1-continued

| Exemplary organoamino-vinylsilane precursors. |
| --- |
| 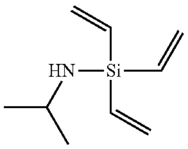 |
| (iso-propylamino)trivinylsilane |
| 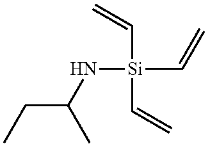 |
| (sec-butylamino)trivinylsilane |
| 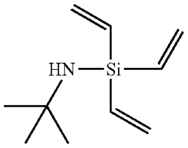 |
| (tert-butylamino)trivinylsilane |
| 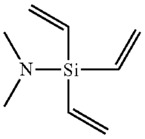 |
| (dimethylamino)trivinylsilane |
| 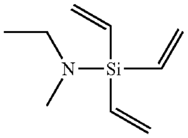 |
| (N-ethylmethylamino)trivinylsilane |
| 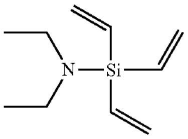 |
| (diethylamino)trivinylsilane |
| 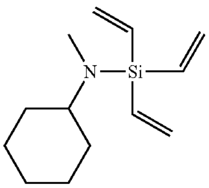 |
| (N-methylcyclohexylamino)trivinylsilane |
| 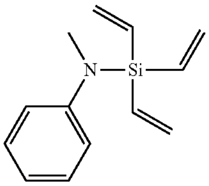 |
| (N-methylphenylamino)methyldivinylsilane |
| 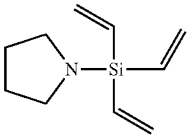 |
| (pyrrolidino)methyltrivinylsilane |
| 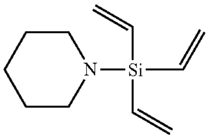 |
| (piperidino)trivinylsilane |
| 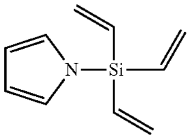 |
| (pyrrolyl)trivinylsilane |

Table 2 lists examples of silicon precursors having at least one vinyl group and at least one organoamino anchoring group connected to at least one silicon atom according to Formula II.

TABLE 2

| Exemplary organoamino-allylsilane precursors. |
| --- |
| 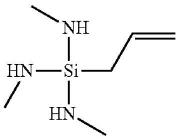 |
| tris(methylamino)allylsilane |
| 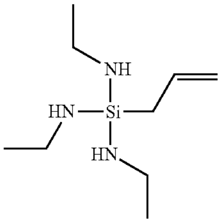 |
| tris(ethylamino)allylsilane |

TABLE 2-continued

Exemplary organoamino-allylsilane precursors.

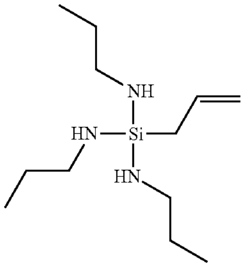 [SMILES: C=CC[Si](NCCC)(NCCC)NCCC]

tris(n-propylamino)allylsilane

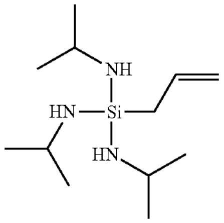 [SMILES: C=CC[Si](NC(C)C)(NC(C)C)NC(C)C]

tris(iso-propylamino)allylsilane

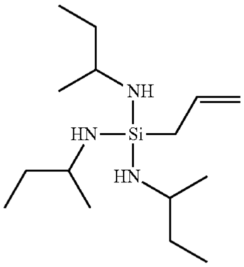 [SMILES: C=CC[Si](NC(C)CC)(NC(C)CC)NC(C)CC]

tris(sec-butylamino)allylsilane

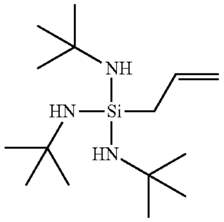 [SMILES: C=CC[Si](NC(C)(C)C)(NC(C)(C)C)NC(C)(C)C]

tris(tert-butylamino)allylsilane

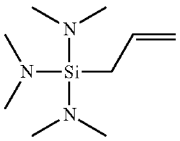

tris(dimethylamino)allylsilane

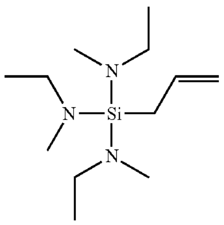 [SMILES: C=CC[Si](N(C)CC)(N(C)CC)N(C)CC]

tris(N-ethylmethylamino)allylsilane

TABLE 2-continued

Exemplary organoamino-allylsilane precursors.

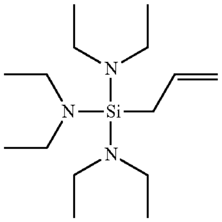 [SMILES: C=CC[Si](N(CC)CC)(N(CC)CC)N(CC)CC]

tris(diethylamino)allyllsilane

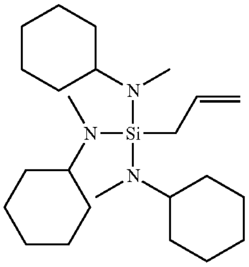 [SMILES: C=CC[Si](N(C)C1CCCCC1)(N(C)C1CCCCC1)N(C)C1CCCCC1]

tris(N-methylcyclohexylamino)allylsilane

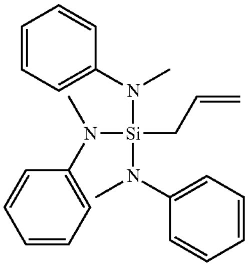 [SMILES: C=CC[Si](N(C)c1ccccc1)(N(C)c1ccccc1)N(C)c1ccccc1]

tris(N-methylphenylamino)allylsilane

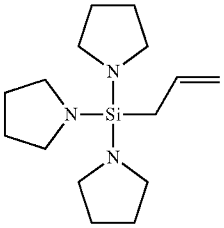 [SMILES: C=CC[Si](N1CCCC1)(N1CCCC1)N1CCCC1]

tri(pyrrolidino)allylsilane

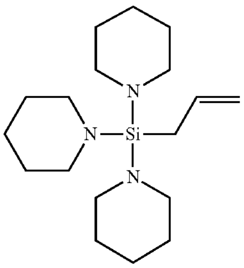 [SMILES: C=CC[Si](N1CCCCC1)(N1CCCCC1)N1CCCCC1]

tri(piperidino)allylsilane

TABLE 2-continued

| Exemplary organoamino-allylsilane precursors. |
|---|
| 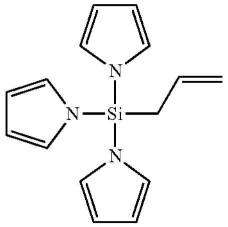 [SMILES: C=CC[Si](n1cccc1)(n1cccc1)n1cccc1] tri(pyrrolyl)allylsilane |
| 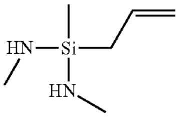 bis(methylamino)methylallylsilane |
| 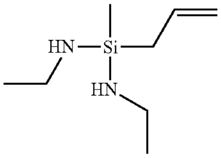 bis(ethylamino)methylallylsilane |
| 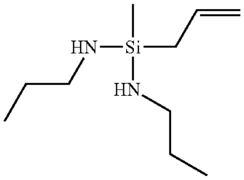 bis(n-propylamino)methylallylsilane |
| 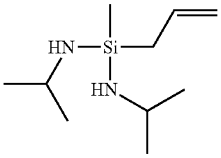 bis(iso-propylamino)methylallylsilane |
| 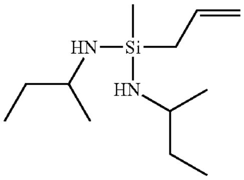 bis(sec-butylamino)methylallylsilane |
| 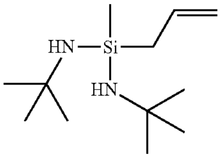 bis(tert-butylamino)methylallylsilane |

TABLE 2-continued

| Exemplary organoamino-allylsilane precursors. |
|---|
| 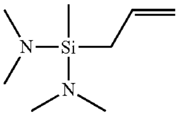 bis(dimethylamino)methylallylsilane |
| 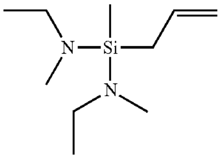 bis(N-ethylmethylamino)methylallylsilane |
| 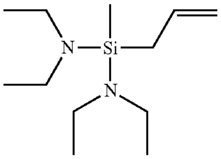 bis(diethylamino)methylallylsilane |
| 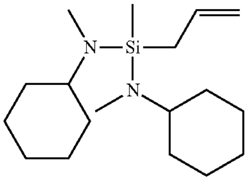 [SMILES: C=CC[Si](C)(N(C)C1CCCCC1)N(C)C1CCCCC1] bis(N-methylcyclohexylamino)methylallylsilane |
| 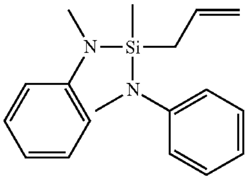 [SMILES: C=CC[Si](C)(N(C)c1ccccc1)N(C)c1ccccc1] bis(N-methylphenylamino)methylallylsilane |
| 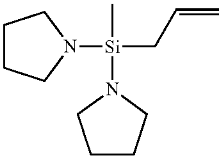 di(pyrrolidino)methylallylsilane |
| 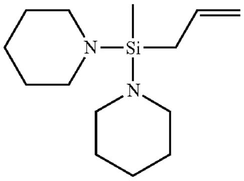 [SMILES: C=CC[Si](C)(N1CCCCC1)N1CCCCC1] di(piperidino)methylallylsilane |

TABLE 2-continued

| Exemplary organoamino-allylsilane precursors. |
| --- |
| 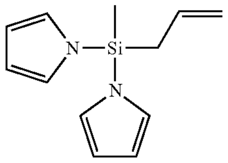<br>di(pyrrolyl)methylallylsilane |
| 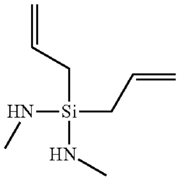<br>bis(methylamino)diallylsilane |
| 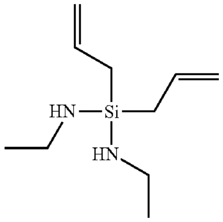<br>bis(ethylamino)diallylsilane |
| 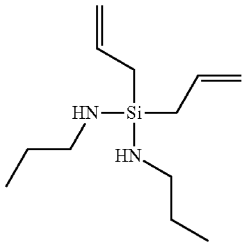<br>bis(n-propylamino)diallylsilane |
| 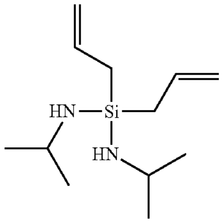<br>bis(iso-propylamino)diallylsilane |
| 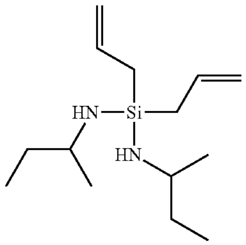 [SMILES: C=CC[Si](CC=C)(NC(C)CC)NC(C)CC]<br>bis(sec-butylamino)diallylsilane |

TABLE 2-continued

| Exemplary organoamino-allylsilane precursors. |
| --- |
| 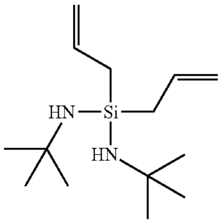 [SMILES: C=CC[Si](CC=C)(NC(C)(C)C)NC(C)(C)C]<br>bis(tert-butylamino)diallylsilane |
| 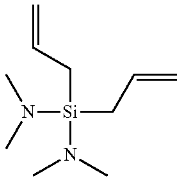<br>bis(dimethylamino)diallylsilane |
| 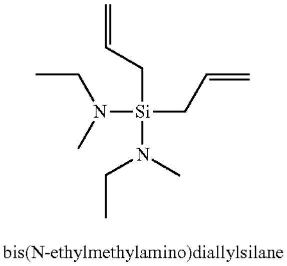<br>bis(N-ethylmethylamino)diallylsilane |
| 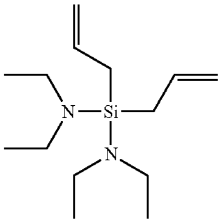 [SMILES: C=CC[Si](CC=C)(N(CC)CC)N(CC)CC]<br>bis(diethylamino)diallylsilane |
| 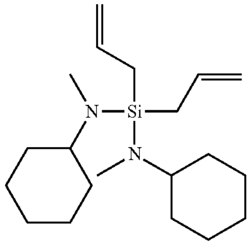 [SMILES: C=CC[Si](CC=C)(N(C)C1CCCCC1)N(C)C1CCCCC1]<br>bis(N-methylcyclohexylamino)diallylsilane |
| 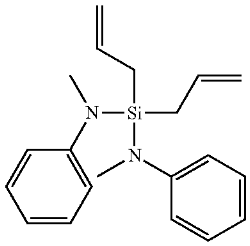 [SMILES: C=CC[Si](CC=C)(N(C)c1ccccc1)N(C)c1ccccc1]<br>bis(N-methylphenylamino)diallylsilane |

TABLE 2-continued

Exemplary organoamino-allylsilane precursors.

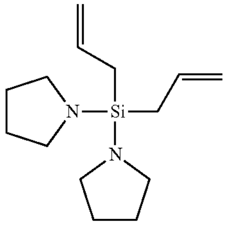 [SMILES: C=CC[Si](CC=C)(N1CCCC1)N1CCCC1]

di(pyrrolidino)diallylsilane

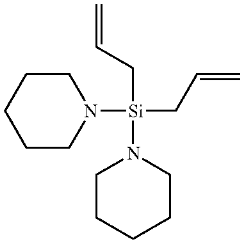 [SMILES: C=CC[Si](CC=C)(N1CCCCC1)N1CCCCC1]

di(piperidino)diallyllsilane

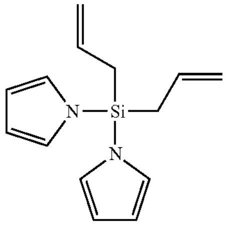 [SMILES: C=CC[Si](CC=C)(n1cccc1)n1cccc1]

di(pyrrolyl)diallylsilane

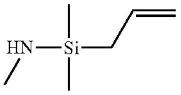

(methylamino)dimethylallylsilane

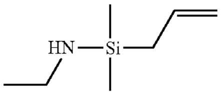

(ethylamino)dimethylallylsilane

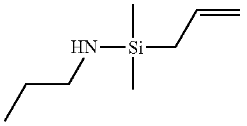

(n-propylamino)dimethylallylsilane

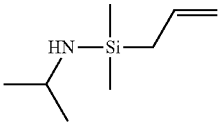

(iso-propylamino)dimethylallylsilane

TABLE 2-continued

Exemplary organoamino-allylsilane precursors.

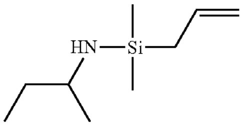

(sec-butylamino)dimethylallylsilane

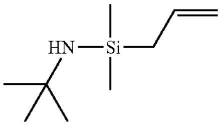

(tert-butylamino)dimethylallylsilane

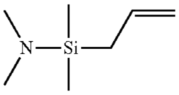

(dimethylamino)dimethylallylsilane

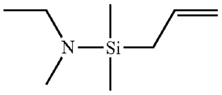

(N-ethylmethylamino)dimethylallylsilane

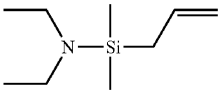

(diethylamino)dimethylallylsilane

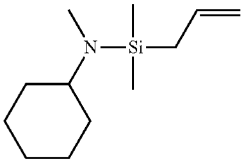

(N-methylcyclohexylamino)dimethylallylsilane

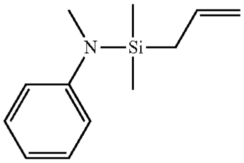

(N-methylphenylamino)dimethylallylsilane

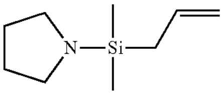

(pyrrolidino)dimethylallylsilane

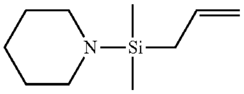

(piperidino)dimethylallylsilane

TABLE 2-continued

Exemplary organoamino-allylsilane precursors.

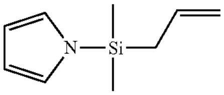

(pyrrolyl)dimethylallylsilane

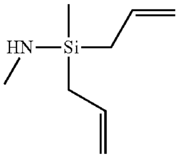

(methylamino)methyldiallylsilane

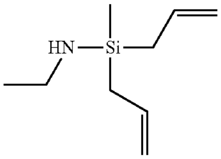

(ethylamino)methyldiallyllsilane

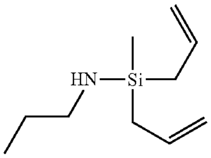

(n-propylamino)methyldiallylsilane

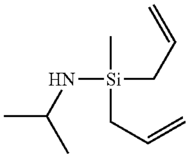

(iso-propylamino)methyldiallylsilane

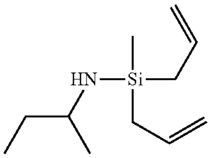

(sec-butylamino)methyldiallylsilane

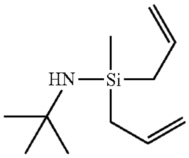

(tert-butylamino)methyldiallylsilane

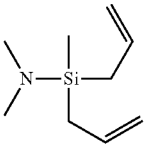

(dimethylamino)methyldiallylsilane

TABLE 2-continued

Exemplary organoamino-allylsilane precursors.

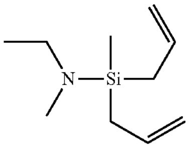

(N-ethylmethylamino)methyldiallylsilane

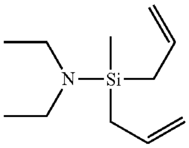

(diethylamino)methyldiallylsilane

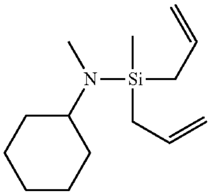 [SMILES: C=CC[Si](C)(CC=C)N(C)C1CCCCC1]

(N-methylcyclohexylamino)methyldiallylsilane

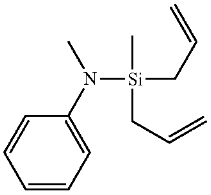 [SMILES: C=CC[Si](C)(CC=C)N(C)c1ccccc1]

(N-methylphenylamino)methyldiallylsilane

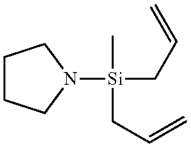

(pyrrolidino)methyldiallylsilane

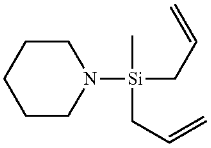

(piperidino)methyldiallylsilane

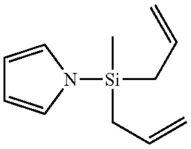

(pyrrolyl)methyldiallylsilane

TABLE 2-continued

Exemplary organoamino-allylsilane precursors.

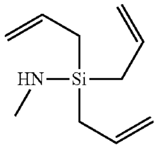

(methylamino)triallylsilane

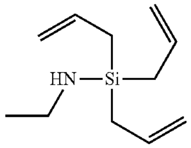

(ethylamino)triallylsilane

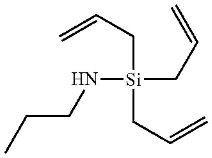

(n-propylamino)triallylsilane

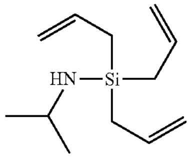

(iso-propylamino)triallylsilane

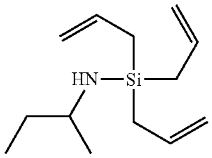

(sec-butylamino)triallylsilane

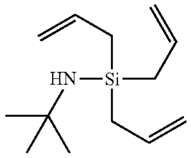

(tert-butylamino)triallylsilane

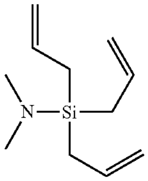

(dimethylamino)triallylsilane

TABLE 2-continued

Exemplary organoamino-allylsilane precursors.

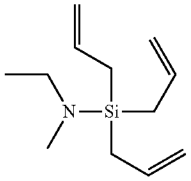

(N-ethylmethylamino)triallylsilane

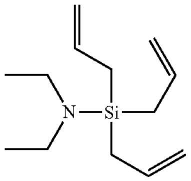

(diethylamino)triallylsilane

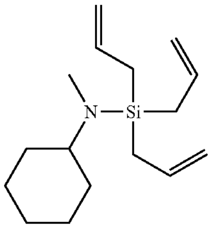 [SMILES: C=CC[Si](CC=C)(CC=C)N(C)C1CCCCC1]

(N-methylcyclohexylamino)triallylsilane

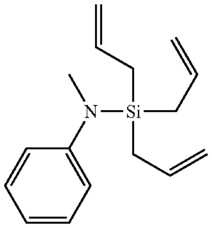 [SMILES: C=CC[Si](CC=C)(CC=C)N(C)c1ccccc1]

(N-methylphenylamino)methyldiallylsilane

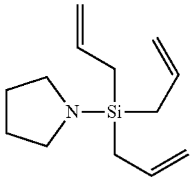

(pyrrolidino)methyltriallylsilane

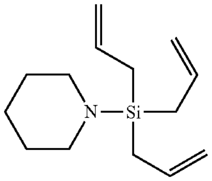 [SMILES: C=CC[Si](CC=C)(CC=C)N1CCCCC1]

(piperidino)triallylsilane

TABLE 2-continued

| Exemplary organoamino-allylsilane precursors. |
|---|
| 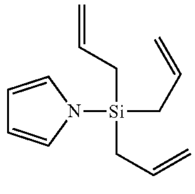 (pyrrolyl)triallylsilane |

The organoamino-vinylsilane and/or organoamino-allylsilane precursors according to the present invention and compositions comprising the organoamino-vinylsilane and/or organoamino-allylsilane precursors according to the present invention are preferably substantially free of organoamines or halide ions. As used herein, the term "substantially free" as it relates to halide ions (or halides) such as, for example, chlorides and fluorides, bromides, and iodides, means less than 5 ppm (by weight), preferably less than 3 ppm, and more preferably less than 1 ppm, and most preferably 0 ppm. As used herein, the term "free of" as it relates to halide ions or other impurities means 0 ppm. Chlorides are known to act as decomposition catalysts for organoamino-vinylsilanes and organoamino-allylsilanes. Significant levels of chloride in the final product can cause the organoamino-vinylsilane and/or organoamino-allylsilane precursor to degrade. The gradual degradation of the organoamino-vinylsilane and/or organoamino-allylsilane may directly impact the film deposition process or surface functionalization process, making it difficult for the semiconductor manufacturer to meet film specifications. In addition, the shelf-life or stability is negatively impacted by the higher degradation rate of the organoamino-vinylsilane and/or organoamino-allylsilane thereby making it difficult to guarantee a 1-2 year shelf-life. Therefore, the accelerated decomposition of the organoamino-vinylsilane and/or organoamino-allylsilane presents safety and performance concerns related to the formation of these flammable and/or pyrophoric gaseous byproducts: organoamines include, but not limited to, $C_1$ to $C_{10}$ organoamines, organodiamines. The silicon precursor compounds having Formulae I and II are preferably substantially free of metal ions such as, $Li^+$, $Na^+$, $K^+$, $Mg^{2+}$, $Ca^{2+}$, $Al^{3+}$, $Fe^{2+}$, $Fe^{2+}$, $Fe^{3+}$, $Ni^{2+}$, $Cr^{3+}$. As used herein, the term "substantially free" as it relates to Li, Na, K, Mg, Ca, Al, Fe, Ni, Cr, noble metal such as volatile Ru or Pt complexes from ruthenium or platinum catalysts used in the synthesis, means less than 5 ppm (by weight), preferably less than 3 ppm, and more preferably less than 1 ppm, and most preferably 0.1 ppm as measured by ICP-MS or other analytical method for measuring trace metals.

The method used to form the silicon-containing films or coatings are deposition processes. Examples of suitable deposition processes for the method disclosed herein include, but are not limited to, cyclic CVD (CCVD), MOCVD (Metal Organic CVD), thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, deposition from supercritical fluids, and low energy CVD (LECVD). In certain embodiments, the metal containing films are deposited via atomic layer deposition (ALD), plasma enhanced ALD (PEALD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the silicon-containing film is deposited using an ALD process. In another embodiment, the silicon-containing film is deposited using a CCVD process. In a further embodiment, the silicon-containing film is deposited using a thermal CVD process. The term "reactor" as used herein, includes without limitation, reaction chamber or deposition chamber.

In certain embodiments, the method disclosed herein avoids pre-reaction of the precursors by using ALD or CCVD methods that separate the precursors prior to and/or during the introduction to the reactor. In this connection, deposition techniques such as ALD or CCVD processes are used to deposit the silicon-containing film. In one embodiment, the film is deposited via an ALD process by exposing the substrate surface alternatively to the one or more the silicon-containing precursor, oxygen-containing source, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases.

In certain embodiments, the method described herein further comprises one or more additional silicon-containing precursors other than the organoamino-vinylsilane and/or organoamino-allylsilane precursors having the above Formula I and/or II. Examples of additional silicon-containing precursors include, but are not limited to, monoaminosilane (e.g., di-iso-propylaminosilane, di-sec-butylaminosilane, phenylmethylaminosilane; organo-silicon compounds such as trisilylamine (TSA); monoaminosilane (di-iso-propylaminosilane, di-sec-butylaminosilane, phenylmethylaminosilane); siloxanes (e.g., hexamethyl disiloxane (HMDSO) and dimethyl siloxane (DMSO), and hexachlorodisiloxane (HCDSO)); organosilanes (e.g., methylsilane, dimethylsilane, diethylsilane, vinyl trimethylsilane, trimethylsilane, tetramethylsilane, ethylsilane, disilylmethane, 2,4-disilapentane, 1,4-disilabutane, 2,5-disilahexane, 2,2-disilylpropane, 1,3,5-trisilacyclohexane and fluorinated derivatives of these compounds); phenyl-containing organo-silicon compounds (e.g., dimethylphenylsilane and diphenylmethylsilane); oxygen-containing organo-silicon compounds, e.g., dimethyldimethoxysilane; 1,3,5,7-tetramethylcyclotetrasiloxane; 1,1,3,3-tetramethyldisiloxane; 1,3,5,7-tetrasila-4-oxo-heptane; 2,4,6,8-tetrasila-3,7-dioxo-nonane; 2,2-dimethyl-2,4,6,8-tetrasila-3,7-dioxo-nonane; octamethylcyclotetrasiloxane; [1,3,5,7,9]-pentamethylcyclopentasiloxane; 1,3,5,7-tetrasila-2,6-dioxo-cyclooctane; hexamethylcyclotrisiloxane; 1,3-dimethyldisiloxane; 1,3,5,7,9-pentamethylcyclopentasiloxane; hexamethoxydisiloxane, and fluorinated derivatives of these compounds.

Depending upon the deposition method, in certain embodiments, the one or more silicon-containing precursors may be introduced into the reactor at a predetermined molar volume, or from about 0.1 to about 1000 micromoles. In this or other embodiments, the silicon-containing and/or organoamino-vinylsilane and/or organoamino-allylsilane precursor may be introduced into the reactor for a predetermined time period. In certain embodiments, the time period ranges from about 0.001 to about 500 seconds.

In certain embodiments, the silicon-containing films deposited using the methods described herein are formed in the presence of oxygen using an oxygen-containing source, reagent or precursor comprising oxygen. An oxygen-containing source may be introduced into the reactor in the form of at least one oxygen-containing source and/or may be present incidentally in the other precursors used in the deposition process. Suitable oxygen-containing source gases may include, for example, water ($H_2O$) (e.g., deionized water, purifier water, and/or distilled water), hydrogen peroxide ($H_2O_2$), oxygen ($O_2$), oxygen plasma, ozone ($O_3$), NO, $N_2O$, $NO_2$, carbon monoxide (CO), carbon dioxide ($CO_2$) and combinations thereof. In certain embodiments, the oxygen-containing source comprises an oxygen-containing source gas that is introduced into the reactor at a flow rate ranging from about 1 to about 2000 square cubic centimeters (sccm) or from about 1 to about 1000 sccm. The oxygen-containing source can be introduced for a time that ranges from about 0.1 to about 100 seconds. In one particular embodiment, the oxygen-containing source comprises water having a temperature of 10° C. or greater. In embodiments wherein the film is deposited by an ALD or a cyclic CVD process, the precursor pulse can have a pulse duration that is greater than 0.01 seconds, and the oxygen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between. The oxygen-containing source or reagent is provided in a molecular amount less than a 1:1 ratio to the silicon precursor, so that at least some carbon is retained in the as deposited silicon-containing film.

In certain embodiments, the silicon-containing films comprise silicon and nitrogen. In these embodiments, the silicon-containing films deposited using the methods described herein are formed in the presence of nitrogen-containing source. A nitrogen-containing source may be introduced into the reactor in the form of at least one nitrogen-containing source and/or may be present incidentally in the other precursors used in the deposition process. Suitable nitrogen-containing source gases may include, for example, ammonia, hydrazine, monoalkylhydrazine, dialkylhydrazine, nitrogen, nitrogen/hydrogen, ammonia plasma, nitrogen plasma, nitrogen/hydrogen plasma, and mixture thereof. In certain embodiments, the nitrogen-containing source comprises an ammonia plasma or hydrogen/nitrogen plasma source gas that is introduced into the reactor at a flow rate ranging from about 1 to about 2000 square cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the precursors, oxygen-containing source, the nitrogen-containing source, and/or other precursors, source gases, and/or reagents may be performed by changing the time for supplying them to change the stoichiometric composition of the resulting silicon-containing film.

Energy is applied to the at least one of the precursor, oxygen-containing source, nitrogen-containing source, reducing agent, other precursors or combination thereof to induce reaction and to form the silicon-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The organoamino-vinylsilane and/or organoamino-allylsilane precursors, other silicon-containing precursors, and/or germanium precursors may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

For those embodiments wherein the precursor(s) having Formula I and/or II is used in a composition comprising a solvent and an organoamino-vinylsilane and/or organoamino-allylsilane precursor having Formula I and/or II described herein, the solvent or mixture thereof selected does not react with the organoamino-vinylsilane and/or organoamino-allylsilane. The amount of solvent by weight percentage in the composition ranges from 0.5% by weight to 99.5% or from 10% by weight to 75%. In this or other embodiments, the solvent has a boiling point (b.p.) similar to the b.p. of the precursor having Formula I and/or II or the difference between the b.p. of the solvent and the b.p. of the precursor having Formula I or II is 40° C. or less, 30° C. or less, or 20° C. or less, or 10° C. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-dimethylpiperazine, N,N,N',N'-tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

In another embodiment, a vessel for depositing a silicon-containing film comprising one or more organoamino-vinylsilane and/or organoamino-allylsilane precursor(s) having Formula I or II is described herein. In one particular embodiment, the vessel comprises at least one pressurizable vessel (preferably of stainless steel) fitted with the proper valves and fittings to allow the delivery of one or more precursors to the reactor for a CVD or an ALD process. In this or other embodiments, the organoamino-vinylsilane and/or organoamino-allylsilane precursor having Formula I and/or II is provided in a pressurizable vessel comprised of stainless steel and the purity of the precursor is 98% by weight or greater or 99.5% or greater which is suitable for the majority of semiconductor applications. In certain embodiments, such vessels can also have means for mixing the precursors with one or more additional precursor if desired. In these or other embodiments, the contents of the vessel(s) can be premixed with an additional precursor. Alternatively, the organoamino-vinylsilane and/or organoamino-allylsilane precursor and/or other precursor can be maintained in separate vessels or in a single vessel having separation means for maintaining the organoamino-vinylsilane and/or organoamino-allylsilane precursor and other precursor separate during storage.

In one embodiment of the method described herein, a cyclic deposition process such as CCVD, ALD, or PEALD may be employed, wherein at least one silicon-containing precursor selected from an organoamino-vinylsilane and/or organoamino-allylsilane precursor having the formulae described herein and optionally a nitrogen-containing source such as, for example, ammonia, hydrazine, monoalkylhydrazine, dialkylhydrazine, nitrogen, nitrogen/hydrogen, ammonia plasma, nitrogen plasma, nitrogen/hydrogen plasma are employed.

In certain embodiments, the gas lines connecting from the precursor canisters to the reaction chamber are heated to one or more temperatures depending upon the process requirements and the container of the organoamino-vinylsilane and/or organoamino-allylsilane precursor having the Formula I and/or II described herein is kept at one or more temperatures for bubbling. In other embodiments, a solution comprising the at least one silicon-containing precursor having the formula described herein is injected into a vaporizer kept at one or more temperatures for direct liquid injection.

A flow of argon and/or other gas may be employed as a carrier gas to help deliver the vapor of the at least one organoamino-vinylsilane and/or organoamino-allylsilane precursor to the reaction chamber during the precursor pulsing. In certain embodiments, the reaction chamber process pressure is about 10 Torr or less. In another embodiments, the reaction chamber process pressure is about 5 Torr or less.

For multi-component silicon-containing films, other precursors such as silicon-containing precursors, nitrogen-containing precursors, reducing agents, or other reagents can be alternately introduced into the reactor chamber.

In one embodiment of the method described herein, the silicon oxide or carbon doped silicon oxide film having carbon content ranging from zero at. % to 20 at. % is deposited using a thermal ALD process and a plasma comprising hydrogen to improve film properties. In this embodiment, the method comprises:

a. placing one or more substrates comprising a surface feature into a reactor and heating to reactor to one or more temperatures ranging from ambient temperature to about 550° C. and optionally maintaining the reactor at a pressure of 100 torr or less;
b. introducing into the reactor at least one organoamino-vinylsilane and/or organoamino-allylsilane precursor comprising at least one vinyl and/or allyl group and at least one organoamino anchoring group connected to at least one silicon atom represented by the Formulae I and/or II;
c. purging the reactor with an inert gas thereby removing unreacted silicon precursor and forming a composition comprising the purge gas and silicon precursor;
d. providing an oxygen-containing source into the reactor to react with the surface to form a silicon and oxygen containing film;
e. purging with inert gas to remove reaction by-products;
f. repeating steps b to e to provide a desired thickness of either silicon oxide or carbon doped silicon oxide;

In this or other embodiments, the UV exposure step can be carried out either during film deposition, or once deposition has been completed. In another embodiment, silicon and nitrogen containing film such as silicon nitride or silicon carbonitride can be deposited using the organoamino-vinylsilanes and/or organoamino-allysilanes as described herein with the same steps outlined above except that a nitrogen-containing source is used instead of an oxygen-containing source.

In one embodiment, the substrate includes at least one feature wherein the feature comprises a pattern trench with an aspect ratio of 1:9 or higher, and/or an opening of 180 nm or less.

In an embodiment wherein the film is treated with a plasma, the plasma source is selected from the group consisting of hydrogen plasma, plasma comprising hydrogen and helium, and plasma comprising hydrogen and argon. Hydrogen plasma lowers film dielectric constant and boost the damage resistance to following plasma ashing process while still keeping the carbon content in the bulk almost unchanged.

Throughout the description, the term "ALD or ALD-like" refers to a process including, but not limited to, the following processes: a) each reactant including silicon precursor and reactive gas is introduced sequentially into a reactor such as a single wafer ALD reactor, semi-batch ALD reactor, or batch furnace ALD reactor; b) each reactant including silicon precursor and reactive gas is exposed to a substrate by moving or rotating the substrate to different sections of the reactor and each section is separated by inert gas curtain, i.e. spatial ALD reactor or roll to roll ALD reactor.

Throughout the description, the term "ashing" refers to a process to remove the photoresist or carbon hard mask in semiconductor manufacturing process using a plasma comprising oxygen source such as $O_2$/inert gas plasma, $O_2$ plasma, $CO_2$ plasma, CO plasma, $H_2/O_2$ plasma or combination thereof.

Throughout the description, the term "damage resistance" refers to film properties after oxygen ashing process. Good or high damage resistance is defined as the following film properties after oxygen ashing: film dielectric constant lower than 4.5; carbon content in the bulk (at more than 50 Å deep into film) is within 5 at. % as before ashing; Less than 50 Å of the film is damaged, observed by differences in dilute HF etch rate between films near surface (less than 50 Å deep) and bulk (more than 50 Å deep).

In certain embodiments, the organoamino-vinylsilane and/or organoamino-allylsilane precursors having Formulae I and/or II described herein can also be used as a dopant for metal containing films, such as but not limited to, metal oxide films or metal nitride films. In these embodiments, the metal containing film is deposited using an ALD or CVD process such as those processes described herein using metal alkoxide, metal amide, or volatile organometallic precursors. Examples of suitable metal alkoxide precursors that may be used with the method disclosed herein include, but are not limited to, group 3 to 6 metal alkoxide, group 3 to 6 metal complexes having both alkoxy and alkyl substituted cyclopentadienyl ligands, group 3 to 6 metal complexes having both alkoxy and alkyl substituted pyrrolyl ligands, group 3 to 6 metal complexes having both alkoxy and diketonate ligands; group 3 to 6 metal complexes having both alkoxy and ketoester ligands. Examples of suitable metal amide precursors that may be used with the method disclosed herein include, but are not limited to, tetrakis (dimethylamino)zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), and tetrakis(ethylmethylamino)hafnium (TEMAH), tetrakis(dimethylamino)titanium (TDMAT), tetrakis(diethylamino)titanium (TDEAT), tetrakis(ethylmethylamino)titanium (TEMAT), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino) tantalum, bis(tert-butylimino)bis(dimethylamino)tungsten (BTBMW), bis(tert-butylimino)bis(diethylamino)tungsten, bis(tert-butylimino)bis(ethylmethylamino)tungsten, and combinations thereof. Examples of suitable organometallic precursors that may be used with the method disclosed herein include, but are not limited to, group 3 metal cyclopentadienyls or alkyl cyclopentadienyls. Exemplary Group 3 to 6 metal herein include, but not limited to, Y, La, Ce, Pr, Nd, Sm, Eu, Gd, Tb, Dy, Er, Yb, Lu, Ti, Hf, Zr, V, Nb, Ta, Cr, Mo, and W.

In certain embodiments, the resultant silicon-containing films or coatings can be exposed to a post-deposition treatment such as, but not limited to, a plasma treatment, chemical treatment, ultraviolet light exposure, electron beam exposure, and/or other treatments to affect one or more properties of the film.

In certain embodiments, the silicon-containing films described herein have a dielectric constant of 6 or less. In these or other embodiments, the films can a dielectric constant of about 5 or below, or about 4 or below, or about 3.5 or below. However, it is envisioned that films having other dielectric constants (e.g., higher or lower) can be formed depending upon the desired end-use of the film. An example of the silicon containing or silicon-containing film that is formed using the organoamino-vinylsilane and/or organoamino-allylsilane precursors and processes described herein has the formulation $Si_xO_yC_zN_vH_w$ wherein Si ranges from about 10% to about 40%; O ranges from about 0% to about 65%; C ranges from about 0% to about 75% or from about 0% to about 50%; N ranges from about 0% to about 75% or from about 0% to 50%; and H ranges from about 0% to about 50% atomic percent weight % wherein x+y+z+v+w=100 atomic weight percent, as determined for example, by XPS or other means. Another example of the silicon containing film that is formed using the organoamino-vinylsilane and/or organoamino-allylsilane precursors and processes described herein is silicon carbonitride wherein the carbon content is from 1 at % to 80 at % measured by XPS. In yet, another example of the silicon containing film that is formed using the organoamino-vinylsilane and/or organoamino-allylsilane precursors and processes described herein is amorphous silicon wherein both sum of nitrogen and carbon contents is <10 at %, preferably <5 at %, most preferably <1 at % measured by XPS.

As mentioned previously, the method described herein may be used to deposit a silicon-containing film on at least a portion of a substrate. Examples of suitable substrates include but are not limited to, silicon, germanium doped silicon, germanium, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, a flexible substrate, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nanoelectromechanical systems, thin film transistor (TFT), light emitting diodes (LED), organic light emitting diodes (OLED), IGZO, and liquid crystal displays (LCD).

The methods described herein provide a high quality film including germanium, silicon, silicon carbide, silicon nitride, carbon doped silicon nitride, silicon oxide, silicon oxynitride, carbon doped silicon oxynitride, carbon-doped silicon oxide. The term "high quality" means a film that exhibits one or more of the following characteristics: a density of about 2.1 g/cc or greater, 2.2 g/cc or greater, 2.25 g/cc or greater; a wet etch rate that is 2.5 Å/s or less, 2.0 Å/s or less, 1.5 Å/s or less, 1.0 Å/s or less, 0.5 Å/s or less, 0.1 Å/s or less, 0.05 Å/s or less, 0.01 Å/s or less as measured in a solution of 1:100 of HF to water dilute HF (0.5 wt % dHF) acid, an electrical leakage of about 1 or less e-8 Å/$cm^2$ up to 6 MV/cm); a hydrogen impurity of about 5 e20 at/cc or less as measured by SIMS; very low non-uniformity, low levels of surface roughness, and combinations thereof. With regard to the etch rate, a thermally grown silicon oxide film has 0.5 Å/s etch rate in 0.5 wt % HF.

In certain embodiments, one or more silicon precursors having Formulae I and II described herein can be used to form silicon and oxygen containing films that are solid and are non-porous or are substantially free of pores.

The following examples illustrate methods for preparing organoamino-vinylsilane and/or organoamino-allylsilane precursors, depositing silicon-containing films, generating vinyl-functionalized and/or allyl-functionalized surfaces, and producing germanium seed layers described herein and are not intended to limit it in any way.

EXAMPLES

Example 1. Synthesis of Tris(Ethylamino)Vinylsilane

Under the protection of nitrogen, a solution of ethylamine in THE (800 mL, 2.0 M, 1.60 mol) was added via cannula to a solution of triethylamine (175 g, 1.73 mol) in hexanes (1 liter) in a 3 liter 3-neck round bottom flask equipped with a mechanical stirrer and reflux condenser. The combined solution was chilled to −20° C. and stirred. To this mixture was added dropwise a solution of trichlorovinylsilane (80.0 g, 0.495 mol) in hexanes (80 g) at −20° C. over 2 hours. The resulting white slurry was allowed to warm to room temperature and was stirred for an additional 2 hours. The white solids were removed by filtration over a glass frit, and the solvent was removed under reduced pressure (20 Torr) at room temperature. The resulting concentrated crude liquid was purified by vacuum distillation (1 Torr/45° C.) to afford 55.4 g of tris(ethylamino)vinylsilane. The boiling point was determined by DSC to be 199° C. GC-MS analysis showed the following mass peaks: m/z=187 (M+), 172 (M−15), 160, 143, 129, 118, 100, 86, 72, 57, 44.

Example 2. Treatment of Silica Gel with Tris(Ethylamino)Vinylsilane

Under the protection of nitrogen, 0.5 g of silica gel (Davasil™ grade 645, 60-100 mesh, 150 Å) was stirred in 5 mL of a 50 wt % solution of tris(ethylamino)vinylsilane in THE at 80° C. for 2 hours. The liquid phase was decanted, and the solids were rinsed several times with hot THE before being dried under vacuum. Both the untreated and treated silica gels were analyzed by FTIR spectroscopy as KBr pellets. The sharp peak at 3741 $cm^{-1}$ in the FTIR spectrum of the untreated silica gel corresponding to the isolated surface Si—OH groups was not detected in the FTIR spectrum of the treated silica gel. The treated silica gel showed the following new peaks in the FTIR spectrum: 3418 (N—H), 3062 (vinyl C—H), 3021 (vinyl C—H), 2968 (vinyl C—H), 2935 (ethyl C—H), 2876 (ethyl C—H). This shows that the surface of the silica gel was functionalized with vinyl groups and ethylamino groups at a relatively low temperature and short amount of time after treatment with tris(ethylamino)vinylsilane.

Example 3. Reaction of Triethoxyvinylsilane with Tert-Butylgermane

Approximately 1 mL of a 1:1 molar mixture of triethoxyvinylsilane and tert-butylgermane was sealed in a 9.5 mL stainless steel cell equipped with an internal pressure transducer and thermocouple. The sample was heated to 250° C. and held isothermally for 1 hour. No significant pressure rise was detected, but a mild exothermic thermal event was observed upon temperature-ramping at ~212° C. When the mixture was cooled back to room temperature, it was analyzed by GC and GC-MS. The 1,1-addition and 1,2-addition hydrogermylation products 1-triethoxysilyl-1-(tert-butylgermyl)ethane (minor) and 1-triethoxysilyl-2-(tert-butylgermyl)ethane (major), respectively, were detected according to the following mass peaks: (minor) m/z=324 (M+), 308, 280, 266, 238, 222, 210, 194, 179, 163, 147, 135, 119, 101, 89, 79, 57, 41; (major) m/z=324 (M+), 308, 280, 268, 238, 222, 211, 193, 181, 163, 149, 135, 119, 103, 91, 79, 57, 41. This demonstrates that Ge—H bonds in precursors like germane, digermane, and tert-butylgermane can react with Si-vinyl groups between 200-250° C. in the absence of a catalyst. This supports the proposal of creating a Ge-seed layer on a $SiO_2$ substrate by first functionalizing the surface with vinyl groups, followed by reaction with germane or digermane to create a Ge—H terminated surface prior to germanium CVD growth.

Although the disclosure has been described with reference to certain preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments, but that the invention will include all embodiments falling within the scope of the appended claims.

The invention claimed is:

1. A method of forming a germanium-containing film on at least one surface of a substrate by a deposition process, the method comprising:

providing the at least one surface of the substrate in a reaction chamber, the substrate having exposed surface hydroxy groups;

introducing into the reaction chamber at least one organoamino-vinylsilane precursor comprising at least one vinyl group and at least one organoamino anchoring group connected to at least one silicon atom represented by the following Formula I, or at least one organoamino-allylsilane precursor comprising at least one allyl group and at least one organoamino anchoring group connected to at least one silicon atom represented by the following Formula II:

I

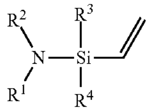

II

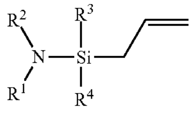

wherein $R^1$ is selected from the group consisting of a linear or branched $C_1$ to $C_{10}$ alkyl group, a linear or branched $C_3$ to $C_{10}$ alkenyl group, a linear or branched $C_3$ to $C_{10}$ alkynyl group, a $C_3$ to $C_{10}$ cyclic alkyl group, and a $C_6$ to $C_{10}$ aryl group; $R^2$ is selected from the group consisting of hydrogen, a linear or branched $C_1$ to $C_{10}$ alkyl group, a linear or branched $C_2$ to $C_6$ alkenyl group, a linear or branched $C_3$ to $C_6$ alkynyl group, a $C_3$ to $C_{10}$ cyclic alkyl group, and a $C_6$ to $C_{10}$ aryl group; $R^3$ and $R^4$ are each independently selected from the group consisting of hydrogen, a linear or branched $C_1$ to $C_{10}$ alkyl group, a linear or branched $C_2$ to $C_6$ alkenyl group, a linear or branched $C_3$ to $C_6$ alkynyl group, a $C_3$ to $C_{10}$ cyclic alkyl group, a $C_6$ to $C_{10}$ aryl group, a $C_1$ to $C_{10}$ linear, cyclic, or branched alkoxy group, an organoamino group ($NR^1R^2$) as defined above, and a halide selected from the group consisting of Cl, Br, and I;

purging the reaction chamber with purge gas;

introducing into the reaction chamber at least one first germanium-containing precursor comprising at least one Ge—H bond;

purging the reaction chamber with purge gas;

introducing into the reaction chamber at least one second germanium-containing precursor that is the same as or different from the first germanium-containing precursor.

2. The method of claim 1 wherein the at least one organoamino-vinylsilane precursor comprises at least one compound selected from the group consisting of tris(methylamino)vinylsilane, tris(ethylamino)vinylsilane, tris(n-propylamino)vinylsilane, tris(iso-propylamino)vinylsilane, tris (sec-butylamino)vinylsilane, tris(tert-butylamino) vinylsilane, tris(dimethylamino)vinylsilane, tris(N-ethylmethylamino)vinylsilane, tris(diethylamino) vinylsilane, tris(N-methylcyclohexylamino)vinylsilane, tris (N-methylphenylamino)vinylsilane, tri(pyrrolidino) vinylsilane, tri(piperidino)vinylsilane tri(pyrrolyl) vinylsilane, bis(methylamino)methylvinylsilane, bis (ethylamino)methylvinylsilane, bis(n-propylamino) methylvinylsilane, bis(iso-propylamino)methylvinylsilane, bis(sec-butylamino)methylvinylsilane, bis(tert-butylamino) methylvinylsilane, bis(dimethylamino)methylvinylsilane bis(N-ethylmethylamino)methylvinylsilane, bis(diethylamino)methylvinylsilane, bis(N-methylcyclohexylamino)methylvinylsilane, bis(N-methylphenylamino)methylvinylsilane, di(pyrrolidino)methylvinylsilane, di(piperidino)methylvinylsilane, di(pyrrolyl)methylvinylsilane, bis(methylamino) divinylsilane, bis(ethylamino)divinylsilane, bis(n-propylamino)divinylsilane, bis(iso-propylamino)divinylsilane, bis (sec-butylamino)divinylsilane, bis(tert-butylamino) divinylsilane, bis(dimethylamino)divinylsilane, bis(N-ethylmethylamino)divinylsilane, bis(diethylamino) divinylsilane, bis(N-methylcyclohexylamino)divinylsilane, bis(N-methylphenylamino)divinylsilane, di(pyrrolidino)divinylsilane, di(piperidino)divinylsilane, di(pyrrolyl)divinylsilane, (methylamino)dimethylvinylsilane, (ethylamino)dimethylvinylsilane, (n-propylamino)dimethylvinylsilane, (iso-propylamino)dimethylvinylsilane, (sec-butylamino)dimethylvinylsilane, (tert-butylamino)dimethylvinylsilane, (dimethylamino)dimethylvinylsilane, (N-ethylmethylamino)dimethylvinylsilane, (diethylamino)dimethylvinylsilane, (N-methylcyclohexylamino)dimethylvinylsilane, (N-methylphenylamino)dimethylvinylsilane, (pyrrolidino) dimethylvinylsilane, (piperidino)dimethylvinylsilane, (pyrrolyl)dimethylvinylsilane, (methylamino)methyldivinylsilane, (ethylamino)methyldivinylsilane, (n-propylamino) methyldivinylsilane, (iso-propylamino)methyldivinylsilane, (sec-butylamino)methyldivinylsilane, (tert-butylamino) methyldivinylsilane, (dimethylamino)methyldivinylsilane, (N-ethylmethylamino)methyldivinylsilane, (diethylamino) methyldivinylsilane, (N-methylcyclohexylamino)methyldivinylsilane, (N-methylphenylamino)methyldivinylsilane, (pyrrolidino)methyldivinylsilane, (piperidino)methyldivinylsilane, (pyrrolyl)methyldivinylsilane, (methylamino) trivinylsilane, (ethylamino)trivinylsilane, (n-propylamino) trivinylsilane, (iso-propylamino)trivinylsilane, (sec-butylamino)trivinylsilane, (tert-butylamino)trivinylsilane, (dimethylamino)trivinylsilane, (N-ethylmethylamino)trivinylsilane, (diethylamino)trivinylsilane, (N-methylcyclohexylamino)trivinylsilane, (N-methylphenylamino)methyldivinylsilane, (pyrrolidino)methyltrivinylsilane, (piperidino)trivinylsilane, and (pyrrolyl)trivinylsilane.

3. The method of claim 1 wherein the at least one organoamino-allylsilane precursor comprises at least one compound selected from the group consisting of tris(methylamino)allylsilane, tris(ethylamino)allylsilane, tris(n-propylamino)allylsilane, tris(iso-propylamino)allylsilane, tris (sec-butylamino)allylsilane, tris(tert-butylamino)allylsilane, tris(dimethylamino)allylsilane, tris(N-ethylmethylamino)allylsilane, tris(diethylamino)allylsilane, tris(N-methylcyclohexylamino)allylsilane, tris(N-methylphenylamino)allylsilane, tri(pyrrolidino)allylsilane, tri(piperidino)allylsilane tri (pyrrolyl) allylsilane, bis(methylamino)methylallylsilane, bis(ethylamino)methylallylsilane, bis(n-propylamino)methylallylsilane, bis(iso-propylamino)methylallylsilane, bis (sec-butylamino)methylallylsilane, bis(tert-butylamino) methylallylsilane, bis(dimethylamino)methylallylsilane bis (N-ethylmethylamino)methylallylsilane, bis(diethylamino) methylallylsilane, bis(N-methylcyclohexylamino) methylallylsilane, bis(N-methylphenylamino) methylallylsilane, di(pyrrolidino)methylallylsilane, di(piperidino)methylallylsilane, di(pyrrolyl)methylallylsilane, bis(methylamino)diallylsilane, bis(ethylamino)diallylsilane, bis(n-propylamino)diallylsilane, bis(iso-propylamino)diallylsilane, bis(sec-butylamino)diallylsilane, bis (tert-butylamino)diallylsilane, bis(dimethylamino) diallylsilane, bis(N-ethylmethylamino)diallylsilane, bis (diethylamino)diallylsilane, bis(N-methylcyclohexylamino) diallylsilane, bis(N-methylphenylamino)diallylsilane, di(pyrrolidino)diallylsilane, di(piperidino)diallylsilane, di(pyrrolyl)diallylsilane, (methylamino)dimethylallylsilane, (ethylamino)dimethylallylsilane, (n-propylamino)dimethylallylsilane, (iso-propylamino)dimethylallylsilane, (sec-butylamino)dimethylallylsilane, (tert-butylamino)dimethylallylsilane, (dimethylamino)dimethylallylsilane, (N-ethylmethylamino)dimethylallylsilane, (diethylamino) dimethylallylsilane, (N-methylcyclohexylamino)dimethylallylsilane, (N-methylphenylamino)dimethylallylsilane, (pyrrolidino)dimethylallylsilane, (piperidino)dimethylallylsilane, (pyrrolyl)dimethylallylsilane, (methylamino)methyldiallylsilane, (ethylamino)methyldiallylsilane, (n-propylamino)methyldiallylilane, (iso-propylamino) methyldiallylsilane, (sec-butylamino)methyldiallylsilane, (tert-butylamino)methyldiallylsilane, (dimethylamino) methyldiallylsilane, (N-ethylmethylamino)methyldiallylsilane, (diethylamino)methyldiallylsilane, (N-methylcyclohexylamino)methyldiallylsilane, (N-methylphenylamino) methyldiallylsilane, (pyrrolidino)methyldiallylsilane, (piperidino)methyldiallylsilane, (pyrrolyl)methyldiallylsilane, (methylamino)triallylsilane, (ethylamino)triallylsilane, (n-propylamino)triallylsilane, (iso-propylamino)triallylsilane, (sec-butylamino)triallylsilane, (tert-butylamino)triallylsilane, (dimethylamino)triallylsilane, (N-ethylmethylamino)triallylsilane, (diethylamino)triallylsilane, (N-methylcyclohexylamino)triallylsilane, (N-methylphenylamino)methyldiallylsilane, (pyrrolidino)methyltriallylsilane, (piperidino)triallylsilane, and (pyrrolyl)triallylsilane.

4. The method of claim 1, wherein the organoamino-vinylsilane or the organoamino-allylsilane is substantially free of at least one impurity selected from the group consisting of organoamines, halide ions, and metal ions.

5. The method of claim 1, wherein the at least one germanium-containing precursor is selected from the group consisting of trichlorogermane ($Cl_3GeH$), germane ($GeH_4$), digermane ($Ge_2H_6$), tert-butylgermane ($^tBuGeH_3$), phenylgermane, sec-butylgemane, A iso-butylgermane, and benzylgermane.

6. The method of claim 1, further comprising introducing into the reaction chamber a reducing gas after introducing the at least one first germanium-containing precursor.

7. The method of claim 1, wherein the at least one surface of the substrate is a silicon-containing film, and wherein the step of providing the at least one surface of the substrate in a reaction chamber comprises performing the following steps until a desired thickness of the silicon-containing film is achieved:

introducing into the reactor the at least one organoamino-vinylsilane or organoamino-allylsilane of Formula I and/or Formula II, purging the reactor with purge gas, introducing an oxygen-containing source and/or a nitrogen-containing source into the reactor, and purging the reactor using purge gas.

8. The method of claim 7 wherein the nitrogen-containing source is selected from the group consisting of ammonia, hydrazine, monoalkylhydrazine, dialkylhydrazine, nitrogen, nitrogen/hydrogen, ammonia plasma, nitrogen plasma, nitrogen/hydrogen plasma, and mixtures thereof.

9. The method of claim 7, wherein the oxygen-containing source is selected from the group consisting of water, hydrogen peroxide, oxygen, oxygen plasma, ozone ($O_3$), nitric oxide, nitrous oxide, nitrogen dioxide, carbon monoxide, carbon dioxide, and mixtures thereof.

10. A composition comprising at least one organoamino-vinylsilane precursor selected from the group consisting of tris(ethylamino)vinylsilane, tris(iso-propylamino)vinylsilane, tris(tert-butylamino)vinylsilane, tris(N-ethylmethylamino)vinylsilane, tris(N-methylcyclohexylamino)vinylsilane, tris(N-methylphenylamino)vinylsilane, tri(pyrrolidino)vinylsilane, tri(piperidino)vinylsilane tri(pyrrolyl)vinylsilane, bis(ethylamino)methylvinylsilane, bis(tert-butylamino)methylvinylsilane, bis(N-methylcyclohexylamino)methylvinylsilane, bis(N-methylphenylamino)methylvinylsilane, di(pyrrolidino)methylvinylsilane, di(piperidino)methylvinylsilane, di(pyrrolyl)methylvinylsilane, bis(ethylamino)divinylsilane, bis(n-propylamino)divinylsilane, bis(sec-butylamino)divinylsilane, bis(N-ethylmethylamino)divinylsilane, bis(diethylamino)divinylsilane, bis(N-methylcyclohexylamino)divinylsilane, bis(N-methylphenylamino)divinylsilane, di(pyrrolidino)divinylsilane, di(piperidino)divinylsilane, di(pyrrolyl)divinylsilane, (n-propylamino)dimethylvinylsilane, (sec-butylamino)dimethylvinylsilane, (tert-butylamino)dimethylvinylsilane, (N-ethylmethylamino)dimethylvinylsilane, (N-methylcyclohexylamino)dimethylvinylsilane, (N-methylphenylamino)dimethylvinylsilane, (pyrrolidino)dimethylvinylsilane, (piperidino)dimethylvinylsilane, (pyrrolyl)dimethylvinylsilane, (methylamino)methyldivinylsilane, (ethylamino)methyldivinylsilane, (n-propylamino)methyldivinylsilane, (iso-propylamino)methyldivinylsilane, (sec-butylamino)methyldivinylsilane, (tert-butylamino)methyldivinylsilane, (dimethylamino)methyldivinylsilane, (N-ethylmethylamino)methyldivinylsilane, (N-methylcyclohexylamino)methyldivinylsilane, (N-methylphenylamino)methyldivinylsilane, (pyrrolidino)methyldivinylsilane, (piperidino)methyldivinylsilane, (pyrrolyl)methyldivinylsilane, (methylamino)trivinylsilane, (ethylamino)trivinylsilane, (n-propylamino)trivinylsilane, (iso-propylamino)trivinylsilane, (sec-butylamino)trivinylsilane, (tert-butylamino)trivinylsilane, (N-ethylmethylamino)trivinylsilane, (diethylamino)trivinylsilane, (N-methylcyclohexylamino)trivinylsilane, (N-methylphenylamino)methyldivinylsilane, (pyrrolidino)methyltrivinylsilane, (piperidino)trivinylsilane, and (pyrrolyl)trivinylsilane.

11. A composition comprising at least one compound selected from the group consisting of tris(methylamino)allylsilane, tris(ethylamino)allylsilane, tris(n-propylamino)allylsilane, tris(iso-propylamino)allylsilane, tris(sec-butylamino)allylsilane, tris(tert-butylamino)allylsilane, tris(N-methylcyclohexylamino)allylsilane, tris(N-methylphenylamino)allylsilane, tri(pyrrolidino)allylsilane, tri(piperidino)allylsilane tri(pyrrolyl) allylsilane, bis(ethylamino)methylallylsilane, bis(n-propylamino)methylallylsilane, bis(sec-butylamino)methylallylsilane, bis(tert-butylamino)methylallylsilane, bis(N-methylcyclohexylamino)methylallylsilane, bis(N-methylphenylamino)methylallylsilane, di(pyrrolidino)methylallylsilane, di(piperidino)methylallylsilane, di(pyrrolyl)methylallylsilane, bis(methylamino)diallylsilane, bis(ethylamino)diallylsilane, bis(n-propylamino)diallylsilane, bis(sec-butylamino)diallylsilane, bis(diethylamino)diallylsilane, bis(N-methylcyclohexylamino)diallylsilane, bis(N-methylphenylamino)diallylsilane, di(pyrrolidino)diallylsilane, di(piperidino)diallylsilane, di(pyrrolyl)diallylsilane, (ethylamino)dimethylallylsilane, (n-propylamino)dimethylallylsilane, (iso-propylamino)dimethylallylsilane, (sec-butylamino)dimethylallylsilane, (tert-butylamino)dimethylallylsilane, (N-ethylmethylamino)dimethylallylsilane, (N-methylcyclohexylamino)dimethylallylsilane, (N-methylphenylamino)dimethylallylsilane, (pyrrolidino)dimethylallylsilane, (piperidino)dimethylallylsilane, (pyrrolyl)dimethylallylsilane, (methylamino)methyldiallylsilane, (ethylamino)methyldiallylsilane, (n-propylamino)methyldiallylilane, (iso-propylamino)methyldiallylsilane, (sec-butylamino)methyldiallylsilane, (tert-butylamino)methyldiallylsilane, (dimethylamino)methyldiallylsilane, (N-ethylmethylamino)methyldiallylsilane, (N-methylcyclohexylamino)methyldiallylsilane, (N-methylphenylamino)methyldiallylsilane, (pyrrolidino)methyldiallylsilane, (piperidino)methyldiallylsilane, (pyrrolyl)methyldiallylsilane, (methylamino)triallylsilane, (ethylamino)triallylsilane, (n-propylamino)triallylsilane, (iso-propylamino)triallylsilane, (sec-butylamino)triallylsilane, (tert-butylamino)triallylsilane, (dimethylamino)triallylsilane, (N-ethylmethylamino)triallylsilane, (diethylamino)triallylsilane, (N-methylcyclohexylamino)triallylsilane, (N-methylphenylamino)methyldiallylsilane, (pyrrolidino)methyltriallylsilane, (piperidino)triallylsilane, and (pyrrolyl)triallylsilane.

* * * * *